United States Patent
Wu

(10) Patent No.: US 10,842,014 B2
(45) Date of Patent: Nov. 17, 2020

(54) MEMORY HEAT DISSIPATION UNIT

(71) Applicant: Tung-Yi Wu, New Taipei (TW)

(72) Inventor: Tung-Yi Wu, New Taipei (TW)

(*) Notice: Subject to any disclaimer, the term of this patent is extended or adjusted under 35 U.S.C. 154(b) by 0 days.

(21) Appl. No.: 15/880,553

(22) Filed: Jan. 26, 2018

(65) Prior Publication Data
US 2019/0215946 A1    Jul. 11, 2019

(51) Int. Cl.
| | | |
|---|---|---|
| H05K 1/00 | (2006.01) | |
| H05K 1/02 | (2006.01) | |
| H05K 7/20 | (2006.01) | |
| F28F 13/06 | (2006.01) | |
| F28D 15/02 | (2006.01) | |
| H01L 23/367 | (2006.01) | |
| F28F 1/24 | (2006.01) | |
| H01L 23/40 | (2006.01) | |
| H01L 21/48 | (2006.01) | |

(52) U.S. Cl.
CPC .......... *H05K 1/0203* (2013.01); *F28D 15/02* (2013.01); *F28F 1/24* (2013.01); *F28F 13/06* (2013.01); *H01L 21/4878* (2013.01); *H01L 23/367* (2013.01); *H01L 23/4093* (2013.01); *H05K 7/20* (2013.01); *H05K 7/20509* (2013.01); *H05K 2201/10159* (2013.01); *H05K 2201/10393* (2013.01); *H05K 2201/10522* (2013.01)

(58) Field of Classification Search
CPC .... H05K 1/0203; H05K 7/20; H05K 7/20509; H05K 2201/10159; H05K 2201/10393; H05K 2201/10522; F28F 13/06
USPC ........................................................ 361/697
See application file for complete search history.

(56) References Cited

U.S. PATENT DOCUMENTS

| | | | | |
|---|---|---|---|---|
| 5,208,732 A | * | 5/1993 | Baudouin | ............ G06K 19/077 257/713 |
| 2004/0130873 A1 | * | 7/2004 | Hsueh | ..................... G06F 1/184 361/697 |
| 2005/0141199 A1 | * | 6/2005 | Chiou | ................. H01L 23/3672 361/704 |
| 2010/0172088 A1 | * | 7/2010 | Lian | ..................... F28D 15/0275 361/679.47 |
| 2013/0186595 A1 | * | 7/2013 | Hsieh | .................. H01L 23/4093 165/80.2 |

FOREIGN PATENT DOCUMENTS

| | | |
|---|---|---|
| CN | 2828895 Y | 10/2006 |
| CN | 200959334 Y | 10/2007 |
| CN | 101188217 A | 5/2008 |
| CN | 103208469 A | 7/2013 |
| TW | M300870 | 11/2006 |
| TW | M340493 | 9/2008 |

* cited by examiner

*Primary Examiner* — Anatoly Vortman
*Assistant Examiner* — Zhengfu J Feng
(74) *Attorney, Agent, or Firm* — Thomas J. Nikolai; DeWitt LLP

(57) ABSTRACT

A memory heat dissipation unit is disclosed. The memory heat dissipation unit includes a main body having a first portion, a second portion and a connection portion having two lateral edges separately connected to the first and the second portion. The first and the second portion have at least one first heat-receiving section and at least one second heat-receiving section formed thereon, respectively; and the first and the second heat-receiving section are correspondingly in contact with at least one memory chip each to exchange heat with the chips and accordingly cool the same.

21 Claims, 29 Drawing Sheets

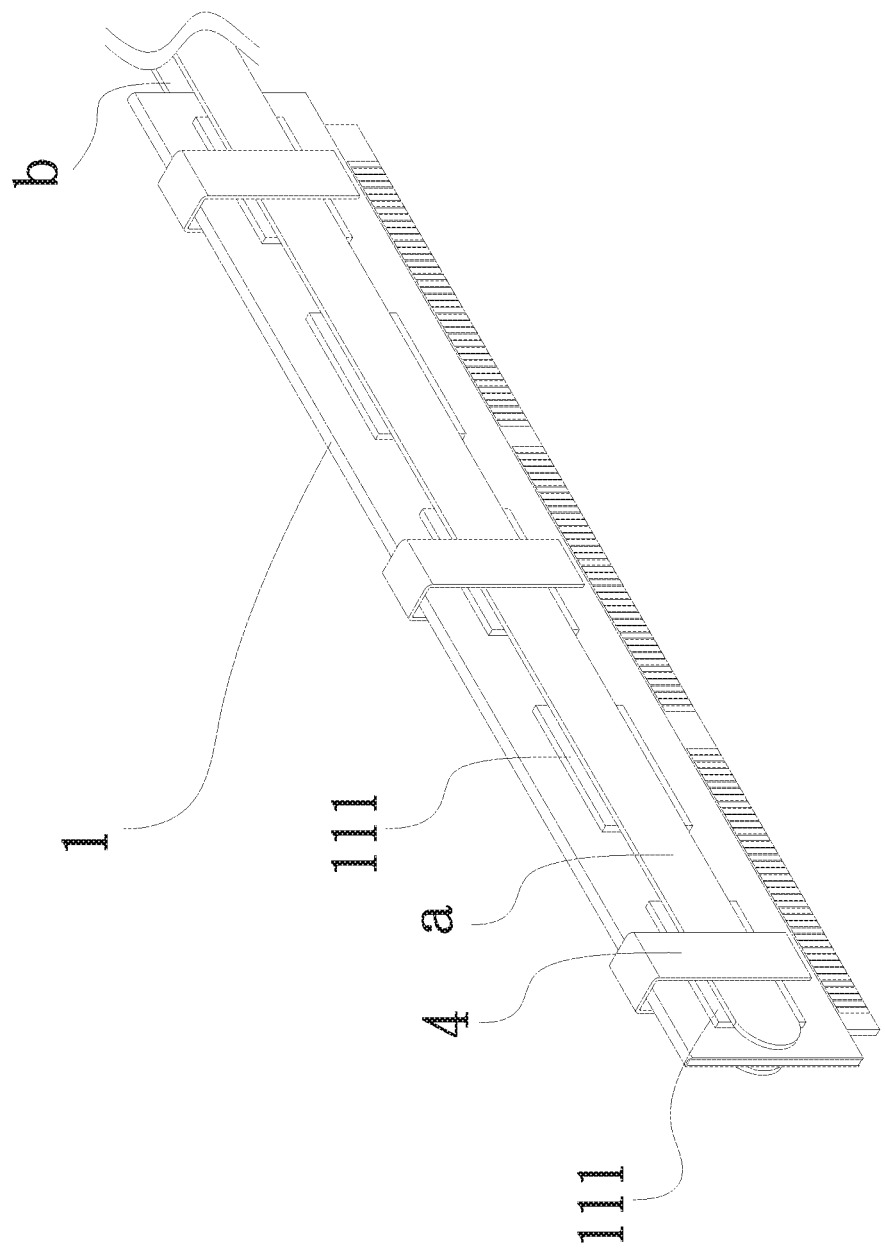

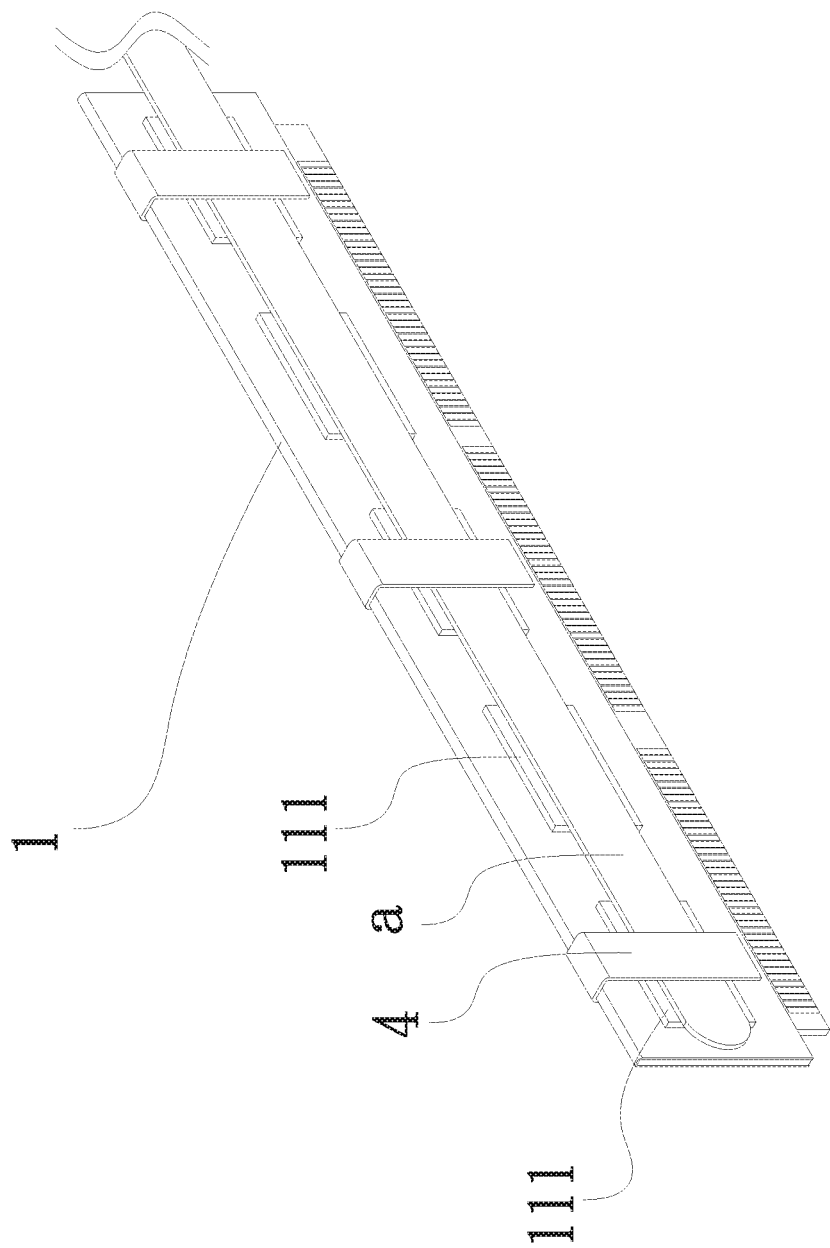

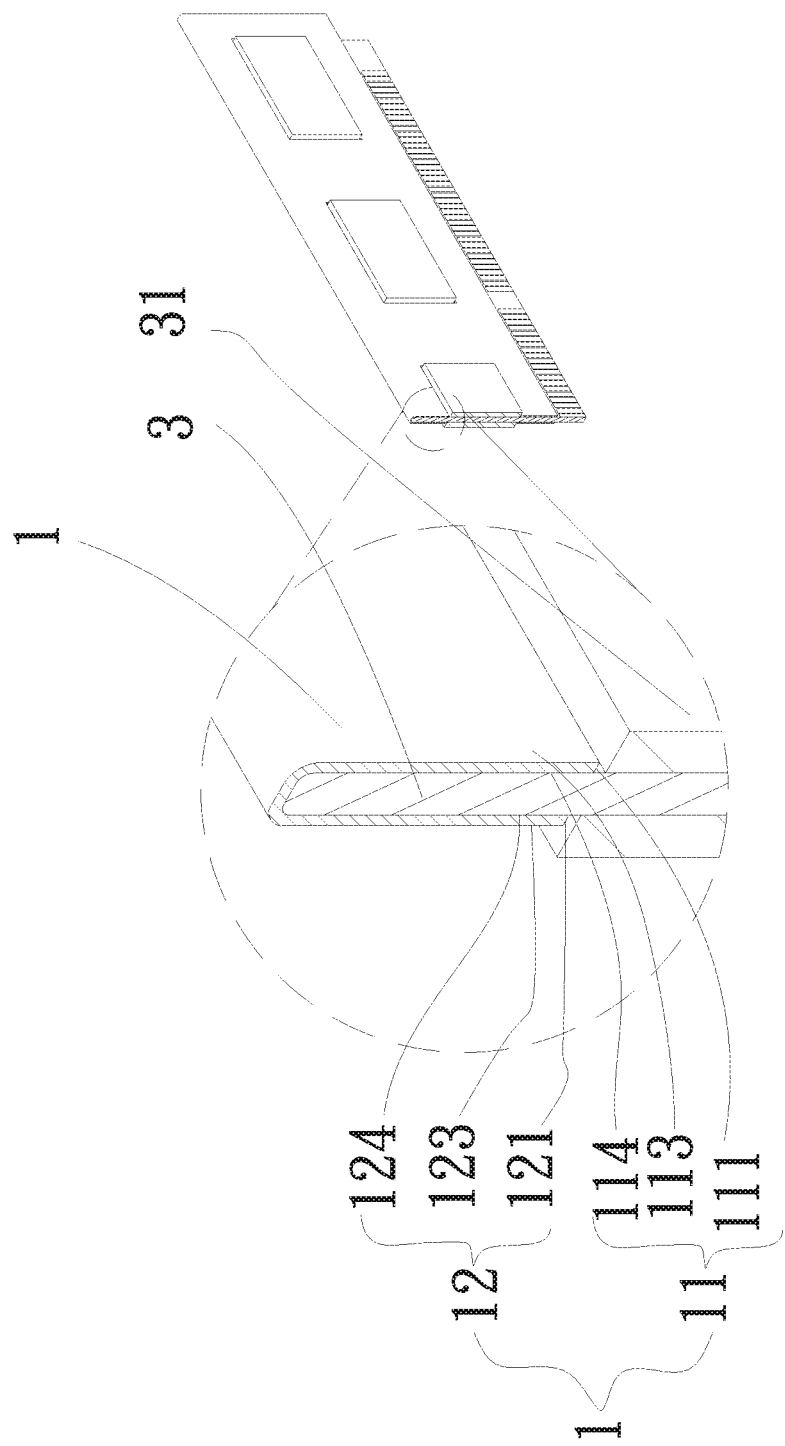

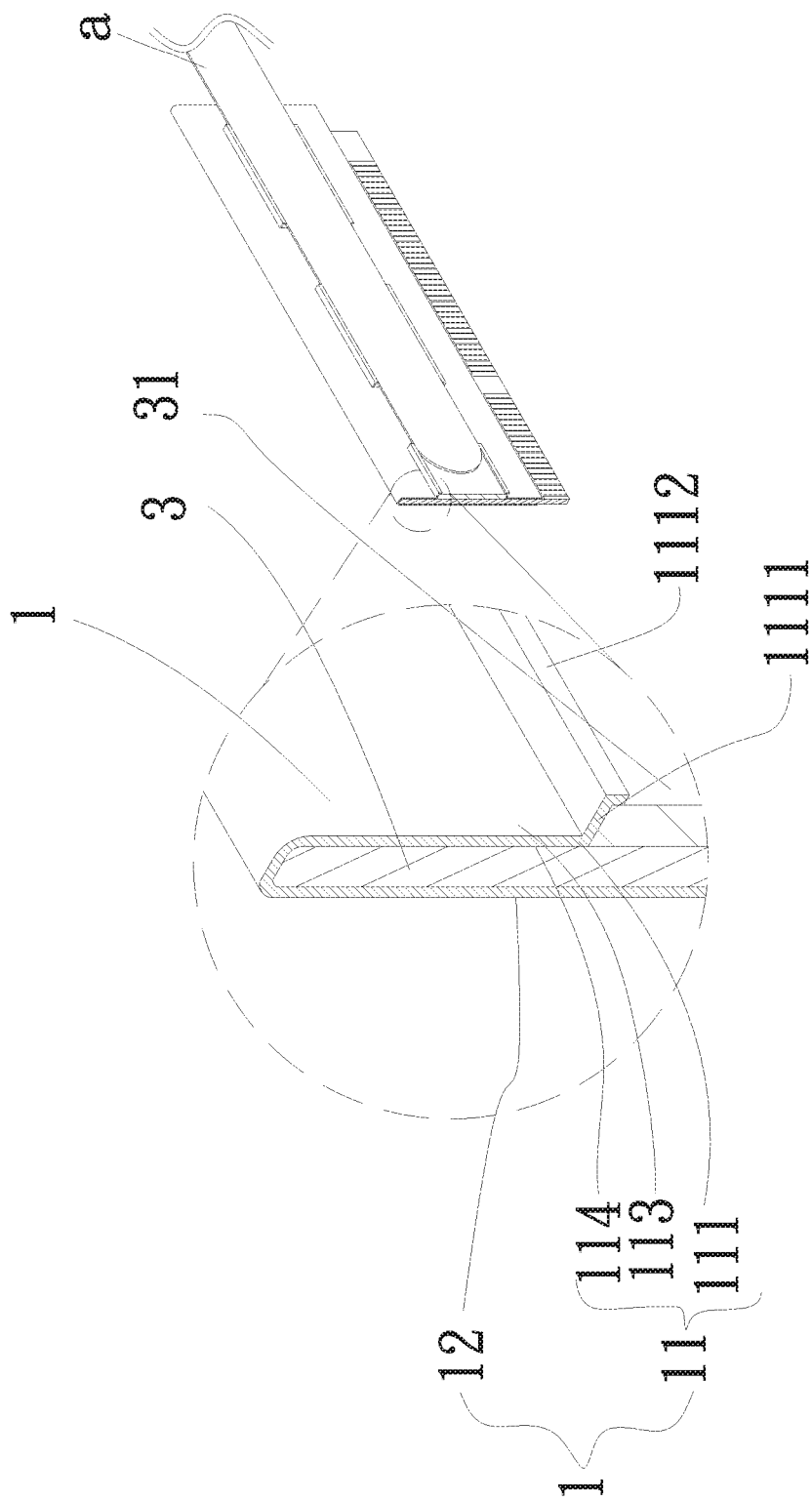

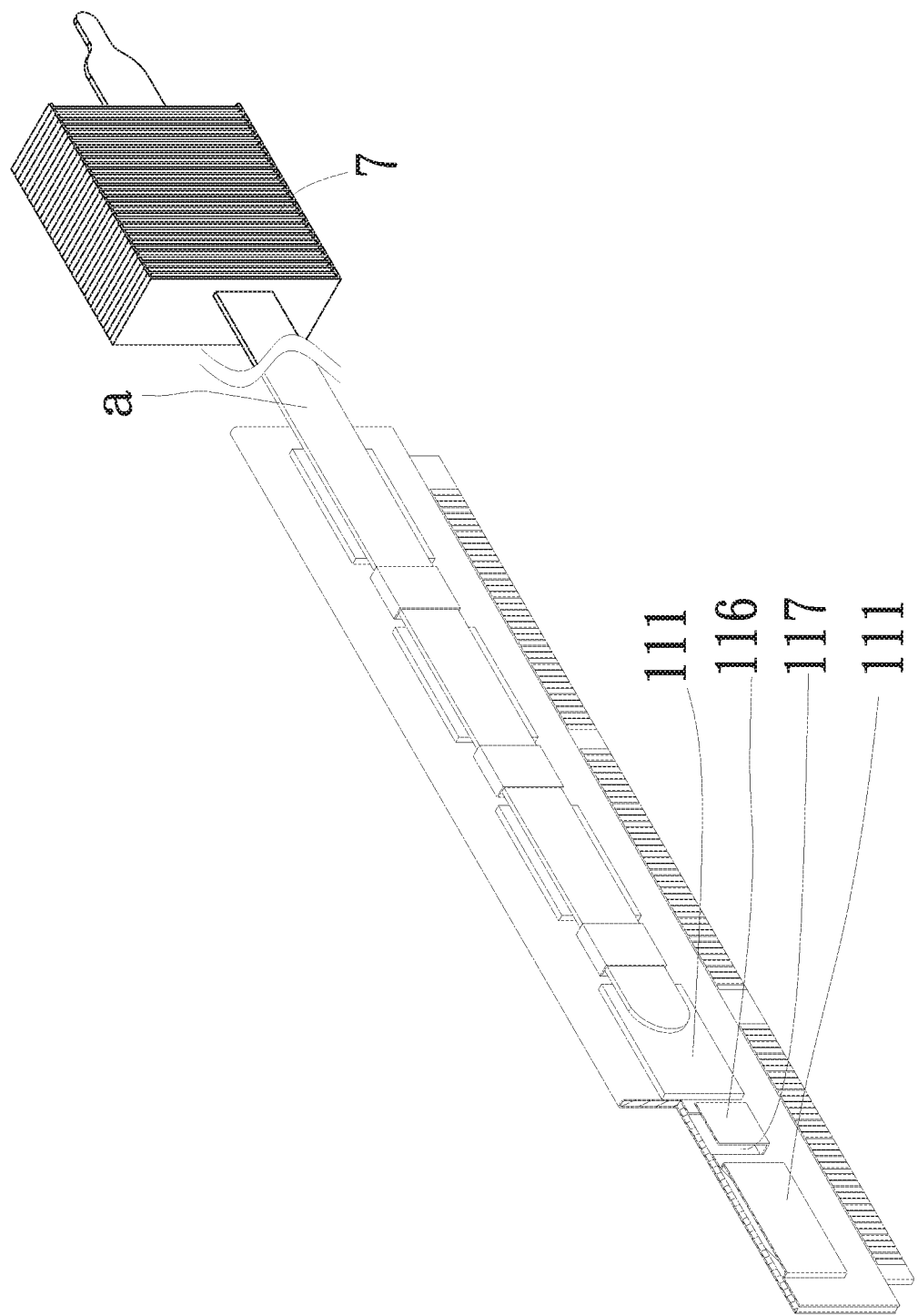

MEMORY HEAT DISSIPATION UNIT

This application claims the priority benefit of Taiwan patent application number 107200198 filed on Jan. 5, 2018 and Taiwan patent application number 107200422 filed on Jan. 10, 2018.

FIELD OF THE INVENTION

The present invention relates to a memory heat dissipation unit, and more particularly, to a heat dissipation unit for dissipating heat produced by memory chips.

BACKGROUND OF THE INVENTION

To achieve constantly increased computing and processing speed, the currently available electronic apparatuses usually include a central processing unit and a plurality of memories that consist of high-performance processing chips. The high-performance chips will produce a high temperature during operation and tend to crash or burn out due to overheat. Therefore, heat dissipation units or memory heat dissipation units sufficient for removal heat from the chips must be provided to prevent the occurrence of chip crash and burnout.

To dissipate heat produced by the memory chips, a single piece of aluminum or copper sheet is general attached to each of two lateral sides of the memory for absorbing and then radiating the produced heat into ambient air. The two aluminum or copper sheets correspondingly attached to the two lateral sides of the memory are normally fixedly connected to the memory using glue, fastening elements, clipping units, etc. In the case there are multiple pieces of memory chips being closely arranged in a quite narrow space, it would be difficult to reserve additional rooms for mounting the above-described heat dissipation sheets to the memory chips for radiating the produced heat into ambient air. Further, since the two corresponding heat dissipation sheets require multiple mounting procedures to be fixedly attached to the memory chips, they are obviously inconvenient for use.

Taiwan Utility Model M300870 discloses a memory heat dissipation clip, which includes an elongated clip having a reverse U-shaped cross section, i.e. having a top surface and two inwardly inclined side surfaces. The top surface is slightly downward curved and has a width substantially the same as that of a general memory. The two inwardly inclined side surfaces together define a downward tapered inner space between them. When the heat dissipation clip is clipped to two lateral sides of a memory, one of the inwardly inclined side surfaces is in tight contact with outer surfaces of chips on the memory, so that heat produced by the chips can be quickly transferred to the heat dissipation clip and then dissipated into ambient air. FIG. 12 shows another conventional heat dissipation clip 9 having a bending section and being used for clipping to two lateral sides of a memory card 8, which has a plurality of chips 80 provided on two opposite sides thereof. The heat dissipation clip 9 includes a horizontal top surface 91, two inner side surfaces 90, and two parallelly spaced vertical sections 93, which are downward extended from two lateral edges of the top surface 91 for connecting to two inwardly inclined side surfaces 92 via a bridging section 94 each. The bridging sections 94 are extended from lower edges of the vertical sections 93 and are first outwardly inclined before they are connected to upper edges of the two inwardly inclined side surfaces 92. A distance D1 between the two parallelly spaced vertical sections 93 is equal to an overall thickness W of the memory card 8, and a maximum distance D3 between the two bridging sections 94 is larger than the distance D1 between the two vertical sections 93, i.e. larger than the overall thickness W of the memory card 8. Further, some of the varying distances between two upper portions H1 of the two inwardly inclined side surfaces 92 are larger than the overall thickness W of the memory card 8 while others are equal to the overall thickness W of the memory card 8. With these arrangements, all the two vertical sections 93, the bridging sections 94 and the upper portions H1 of the two inwardly inclined side surfaces 92 fail to provide the entire heat dissipation clip 9 with sufficient clipping force. In other words, only two lower portions H2 of the two inwardly inclined side surfaces 92, which have varying distances between them smaller than the overall thickness W of the memory card 8, can provide the heat dissipation clip 9 with an amount of clipping force for clipping onto the memory card 8. This structure renders the heat dissipation clip 9 unable to firmly clip to and tightly contact with two lateral sides of the memory card 8, which results in poor heat dissipation of the memory card 8.

Moreover, since the heat dissipation clip 9 includes two outwardly inclined bridging sections 94 and then two inwardly inclined side surfaces 92, it is relatively difficult to design and manufacture forming molds for the heat dissipation clip 9 and to manufacture the heat dissipation clip 9 via an automated production system.

U.S. Pat. No. 9,016,353 discloses a memory device and a heat dissipation clip 5 thereof in an attempt to improve the heat dissipation clip 9 shown in FIG. 12. Please refer to FIG. 13. The heat dissipation clip 5 is formed by bending a flexible and thermally conductive metal sheet, and includes a horizontal top portion 51 and two facing side portions 53 vertically downward extended from two opposite edges of the top portion 51. Each of the side portions 53 includes an upper section 531, an inwardly inclined section 533, and a guide angle section 535. The two upper sections 531 are directly extended from the two opposite edges of the top portion 51 and are slightly inclined toward each other. The two inwardly inclined sections 533 are extended from lower edges of the two upper sections 531 while keeping inclined toward each other. The two guide angle sections 535 are extended from lower edges of the two inwardly inclined sections 533 and inclined outward. When the heat dissipation clip 5 is clipped to two lateral sides of a memory card 10, the two side portions 53 are in tight contact with outer surfaces of chips 100 provided on the lateral sides of the memory card 10, so that heat produced by the chips 100 can be dissipated into ambient air via the heat dissipation clip 5. Similarly to the heat dissipation clip 5, the heat dissipation clip 9 includes two inwardly inclined sections 533 for clamping on the outer surfaces of the chips 100 on the memory card 10 and dissipating the chip-produced heat into ambient air. Since the two inwardly inclined sections 533 are not parallel to each other, clearances will exist between them and the chips 100 when the heat dissipation clip 5 is clipped onto the memory card 10. Such clearances will result in thermal resistance between the heat dissipation clip 5 and the chips 100. While the heat dissipation clip 5 has a simplified structure and can be easily manufactured, its clipping force will be adversely affected if the metal material selected for making it has poor inductivity or elastic deformability.

It is therefore tried by the inventor to develop an improved memory heat dissipation unit to overcome the drawbacks of the conventional heat dissipation clips for dissipating heat from the memory into ambient air.

SUMMARY OF THE INVENTION

A primary object of the present invention is to provide a memory heat dissipation unit to overcome the drawbacks of the prior art heat devices for dissipating heat produced by a memory.

To achieve the above and other objects, a preferred embodiment of the memory heat dissipation unit according to the present invention includes a main body having a first portion, a second portion and a connection portion having two lateral edges separately connected to the first and the second portion. The first and the second portion have at least one first heat-receiving section and at least one second heat-receiving section formed thereon, respectively; and the first and the second heat-receiving section are respectively in contact with at least one memory chip to exchange heat with the chips.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 2 is a perspective view of the memory heat dissipation unit of the present invention according to a second variation of the first embodiment thereof;

FIG. 2a is a perspective view of the memory heat dissipation unit of the present invention according to a third variation of the first embodiment thereof;

FIG. 4 is a cutaway view of a third embodiment of the memory heat dissipation unit according to the present invention;

FIG. 5c is a cutaway view of the memory heat dissipation unit of the present invention according to a fifth variation of the third embodiment thereof;

FIG. 6a is a cutaway view of the memory heat dissipation unit of the present invention according to a first variation of the fourth embodiment thereof;

DETAILED DESCRIPTION OF THE PREFERRED EMBODIMENTS

Figure 1:
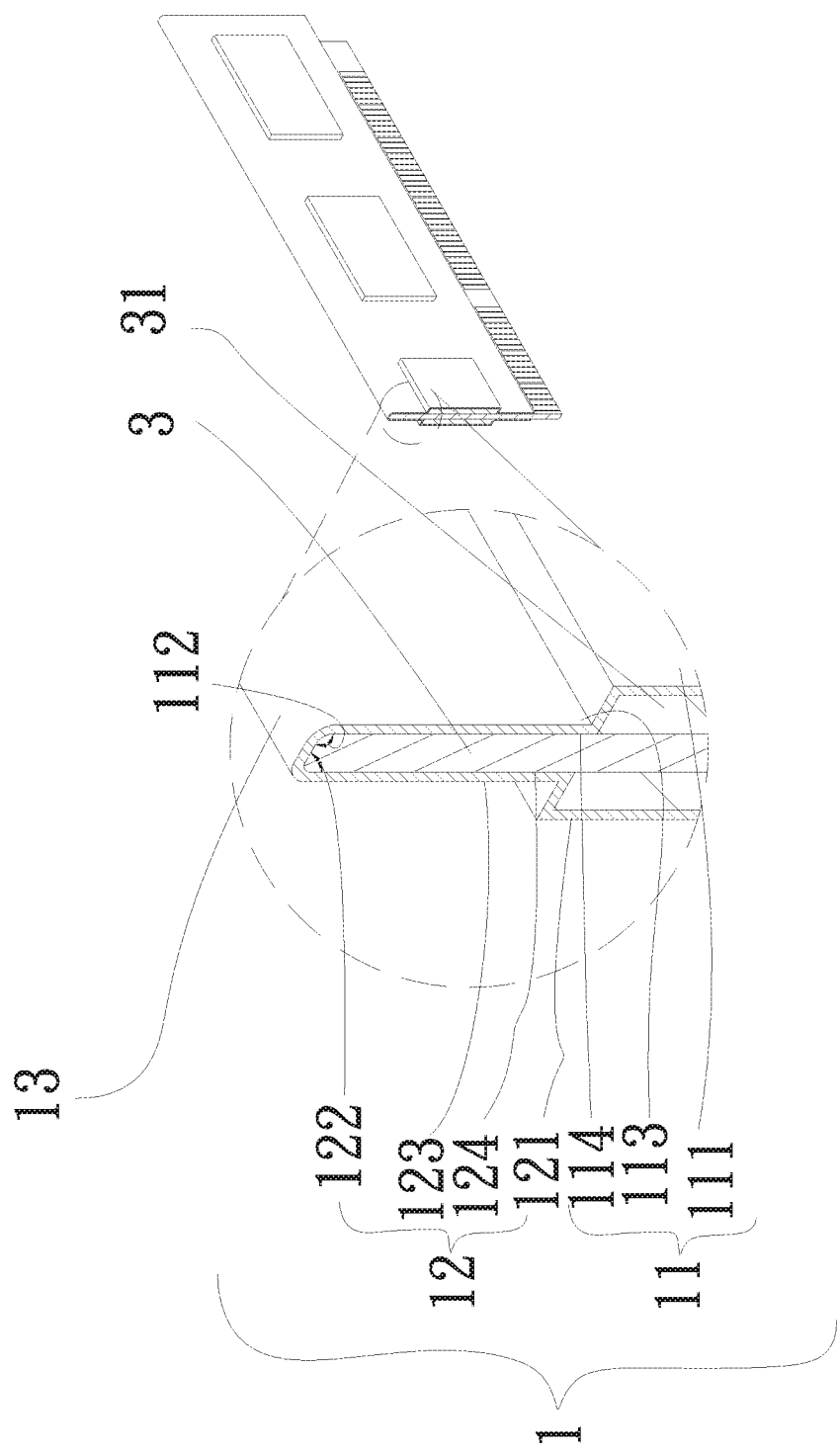
FIG. 1 is a cutaway view of a first embodiment of a memory heat dissipation unit according to the present invention.

The present invention will now be described with some preferred embodiments thereof and by referring to the accompanying drawings. For the purpose of easy to understand, elements that are the same in the preferred embodiments are denoted by the same reference numerals.

Figure 1A:
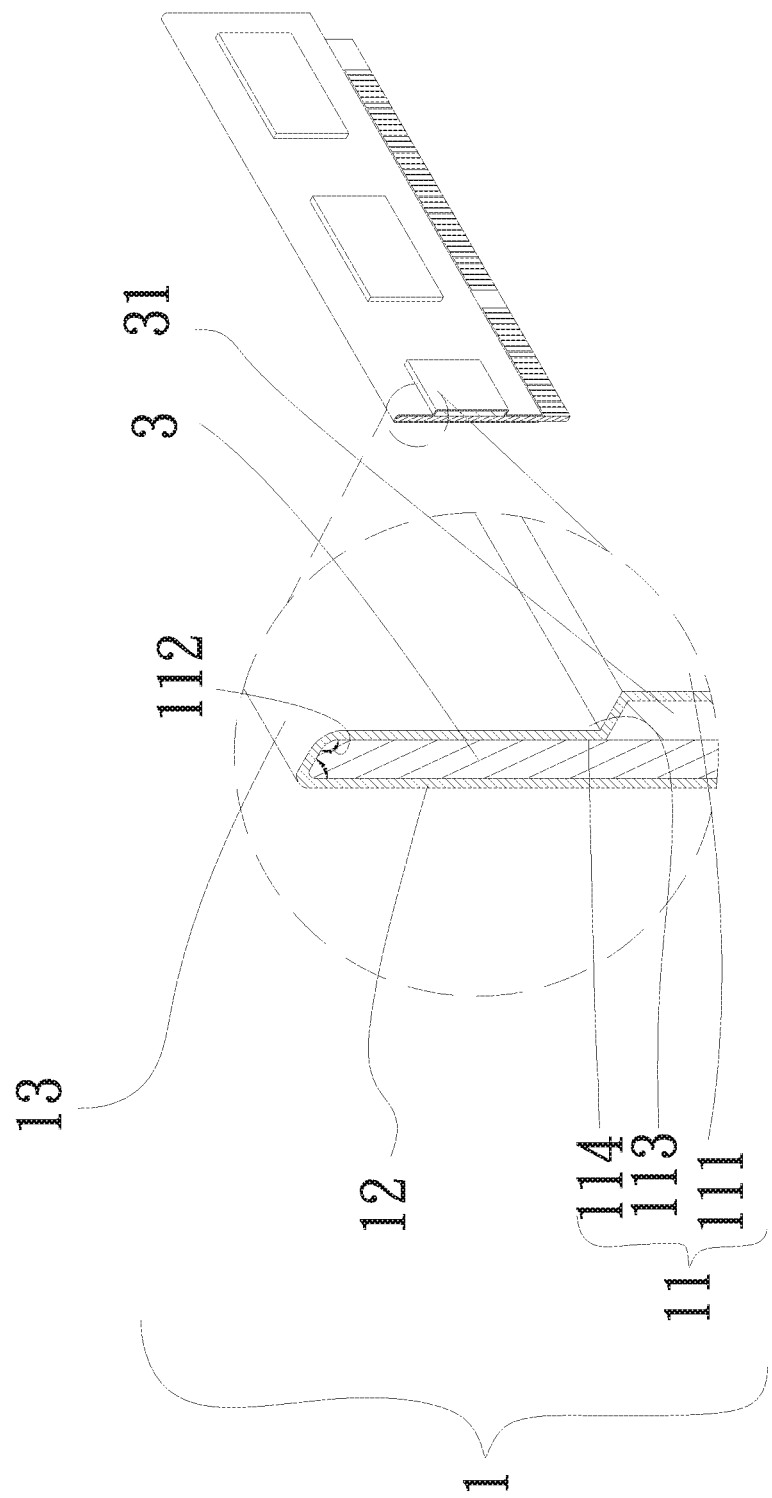
FIG. 1a is a cutaway view of the memory heat dissipation unit of the present invention according to a first variation of the first embodiment thereof.

Please refer to FIG. 1, which is a cutaway view of a first embodiment of a memory heat dissipation unit according to the present invention; and to FIGS. 1*a*, 2 and 2*a*, which sequentially show first, second and third variations of the first embodiment of the memory heat dissipation unit. As shown, the memory heat dissipation unit according to the present invention includes a main body 1.

In the first embodiment, the main body 1 includes a first portion 11, a second portion 12 and a connection portion 13 having two lateral edges separately connected to the first and the second portion 11, 12. The first and the second portion 11, 12 have at least one first heat-receiving section 111 and at least one second heat-receiving section 121, respectively, for correspondingly contacting with chips 31 provided on at least one memory 3 to exchange heat with the chips 31.

A first included angle 112 is defined between the first portion 11 and the connection portion 13, and a second included angle 122 is defined between the second portion 12 and the connection portion 13. Both of the first and the second included angle 112, 122 are smaller than or equal to 90°.

The first portion 11 has a first outer surface 113 and a first inner surface 114. The first outer and inner surfaces 113, 114 are correspondingly outwardly expanded at predetermined areas to form the first heat-receiving sections 111. Similarly, the second portion 12 has a second outer surface 123 and a second inner surface 124. The second outer and inner surfaces 123, 124 are correspondingly outwardly expanded at predetermined areas to form the second heat-receiving sections 121.

The memory heat dissipation unit according to the present invention is used to remove heat from a memory 3. For this purpose, the first inner surface 114 and the second inner surface 124 are designed for fitly contacting with outer surfaces of the memory 3. More specifically, the first part 11 and the second part 12 are provided with the first and the second heat-receiving sections 111, 121, which are shaped to correspondingly engage with the chips 31 raised from the outer surfaces of the memory 3. In the illustrated first embodiment, the first and the second heat-receiving sections 111, 121 are shaped to correspondingly cover and contact with outer surfaces of the chips 31 to enable heat exchange with the chips 31.

According to the first variation of the first embodiment of the memory heat dissipation unit, the heat-receiving sections can be provided on only one of the first and the second portion 11, 12. In FIG. 1a, the first variation is illustrated to have the first heat-receiving sections 111 provided on the first portion 11.

According to the second variation of the first embodiment of the memory heat dissipation unit as shown in FIG. 2, the first and the second heat-receiving sections 111, 121 are further externally in direct contact with a first heat-transfer element a and a second heat-transfer element b, respectively, to exchange heat with the first and the second heat-transfer element a, b. The first and the second heat-transfer element a, b can be adhesively bonded to or be welded to the main body 1. Alternatively, the first and the second heat-transfer element a, b can be secured to the main body 1 by means of U-shaped clips 4.

According to the third variation of the first embodiment of the memory heat dissipation unit, the heat-receiving sections can be provided on only one of the first and the second portion 11, 12 to contact with a heat-transfer element. In FIG. 2a, the third variation is illustrated to have the first heat-receiving sections 111 provided on the first portion 11 and a first heat-transfer element a is correspondingly provided for directly contacting with the first heat-receiving sections 111 to exchange heat with the latter.

Figure 3:
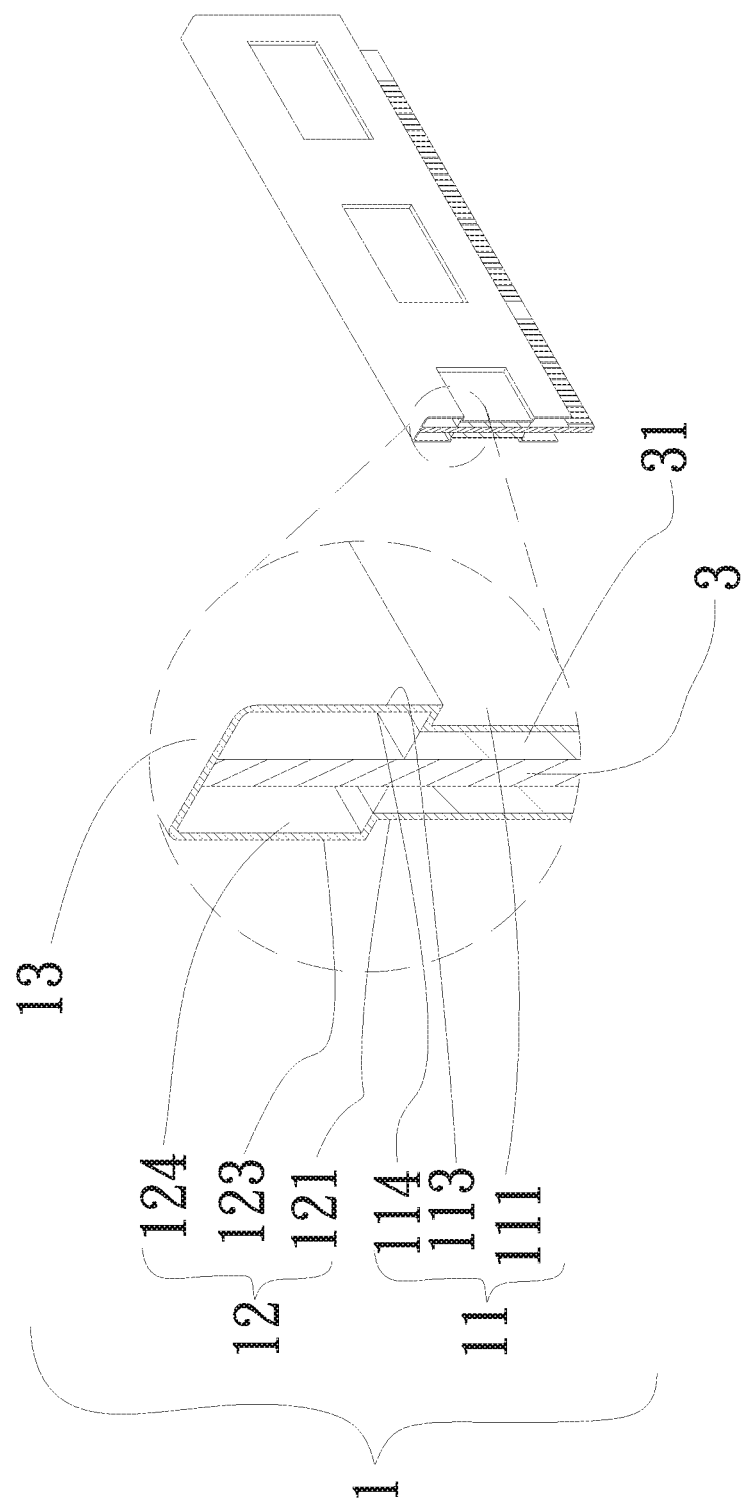
FIG. 3 is a cutaway view of a second embodiment of the memory heat dissipation unit according to the present invention.
Figure 3A:
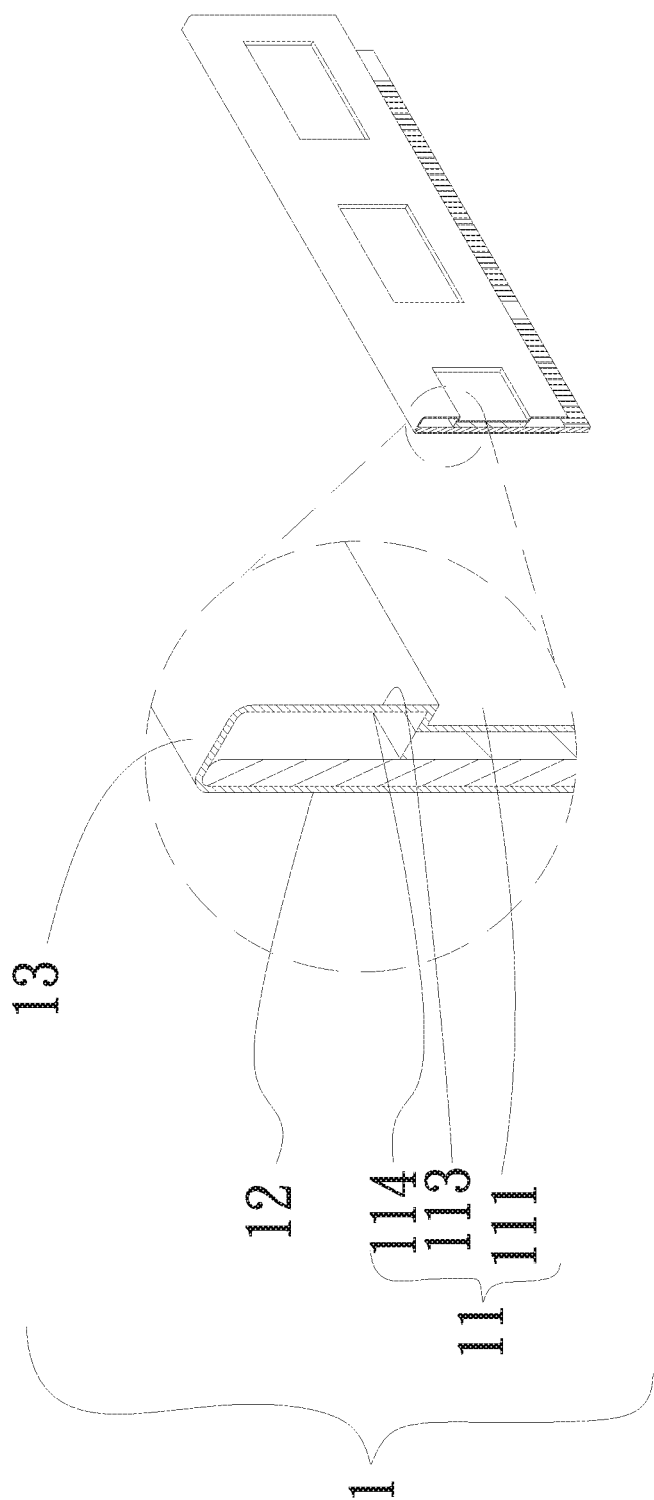
FIG. 3a is a cutaway view of the memory heat dissipation unit of the present invention according to a first variation of the second embodiment thereof.

Please refer to FIGS. 3 and 3a, which are cutaway views of a second embodiment and a first variation thereof, respectively, of the memory heat dissipation unit according to the present invention. As shown, in the second embodiment, the memory heat dissipation unit also includes a first portion 11 having a first outer surface 113 and a first inner surface 114, and a second portion 12 having a second outer surface 123 and a second inner surface 124. However, unlike the first embodiment, the first outer and inner surface 113, 114 in the second embodiment are inwardly depressed at predetermined areas to form at least one first heat-receiving section 111; and the second outer and inner surface 123, 124 in the second embodiment are also inwardly depressed at predetermined areas to form at least one second heat-receiving section 121. In other words, in the second embodiment of the memory heat dissipation unit, the first and the second heat-receiving sections 111, 121 are areas on the first and the second portion 11, 12, respectively, that are inward recessed toward one another for pressing against outer surfaces of chips 31 provided on the memory 3 to exchange heat with the latter.

According to the first variation of the second embodiment of the memory heat dissipation unit, the heat-receiving sections can be provided on only one of the first and the second portion 11, 12. In FIG. 3a, the first variation of the second embodiment is illustrated to have the first heat-receiving sections 111 provided on the first portion 11.

Figure 4A:
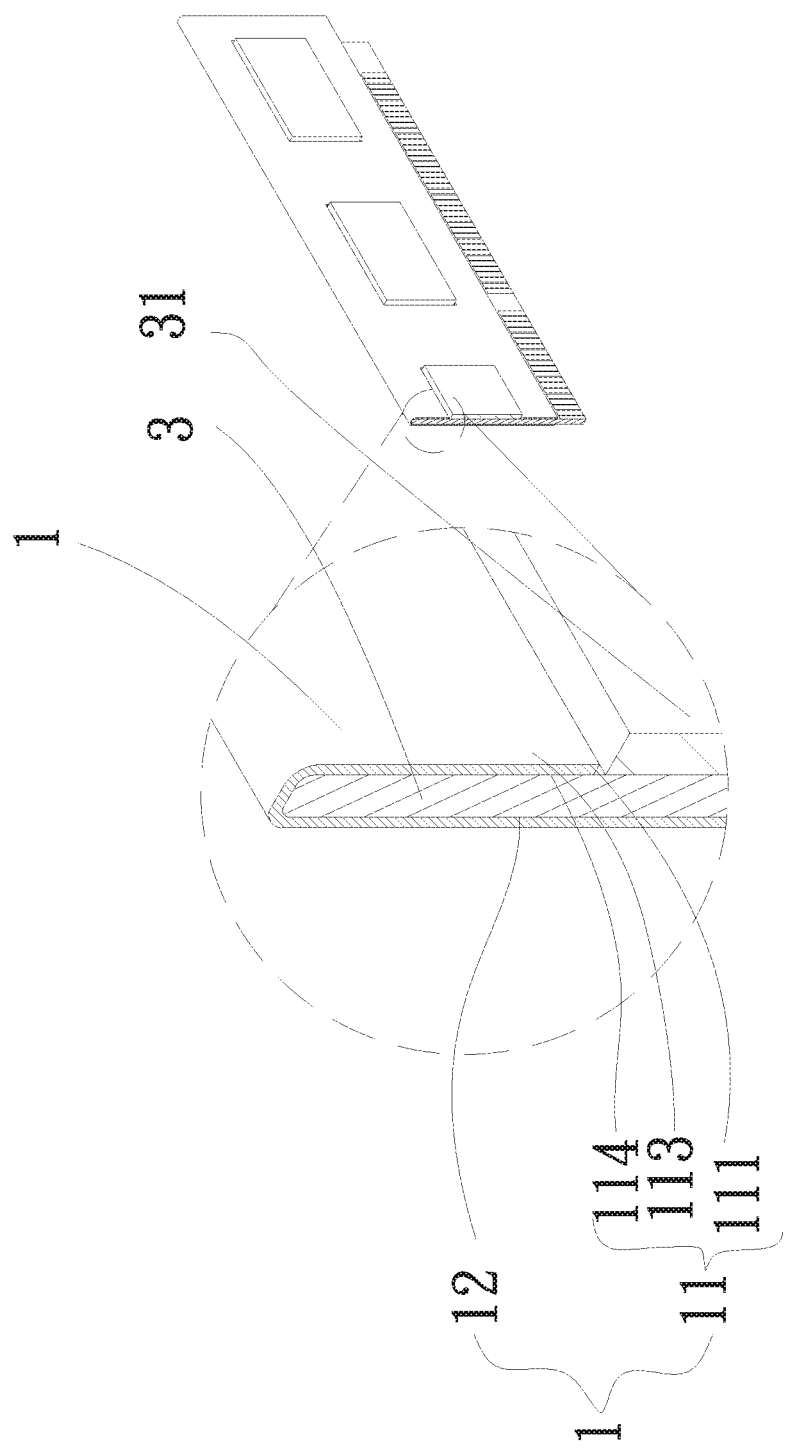
FIG. 4a is a cutaway view of the memory heat dissipation unit of the present invention according to a first variation of the third embodiment thereof.

Please refer to FIG. 4, which is a cutaway view of a third embodiment of the memory heat dissipation unit according to the present invention; and to FIGS. 4a, 5, 5a, 5b and 5c, which sequentially show first, second, third, fourth and fifth variations of the third embodiment of the memory heat dissipation unit. Unlike the first embodiment, the third embodiment includes first and second heat-receiving sections 111, 121 that are openings formed on and penetrating the first and the second portion 11, 12, respectively, to communicate the first outer surface 113 with the first inner surface 114 and the second outer surface 123 with the second inner surface 124. In this case, the chips 31 provided on the outer surfaces of the memory 3 are located corresponding to the openings of the first and the second heat-receiving sections 111, 121 to expose from the main body 1 via the openings, so that heat produced by the chips 31 is dissipated by radiation.

According to the first variation of the third embodiment of the memory heat dissipation unit, the heat-receiving sections can be provided on only one of the first and the second portion 11, 12. In FIG. 4a, the first variation is illustrated to have the first heat-receiving sections 111 provided on the first portion 11.

Figure 5:
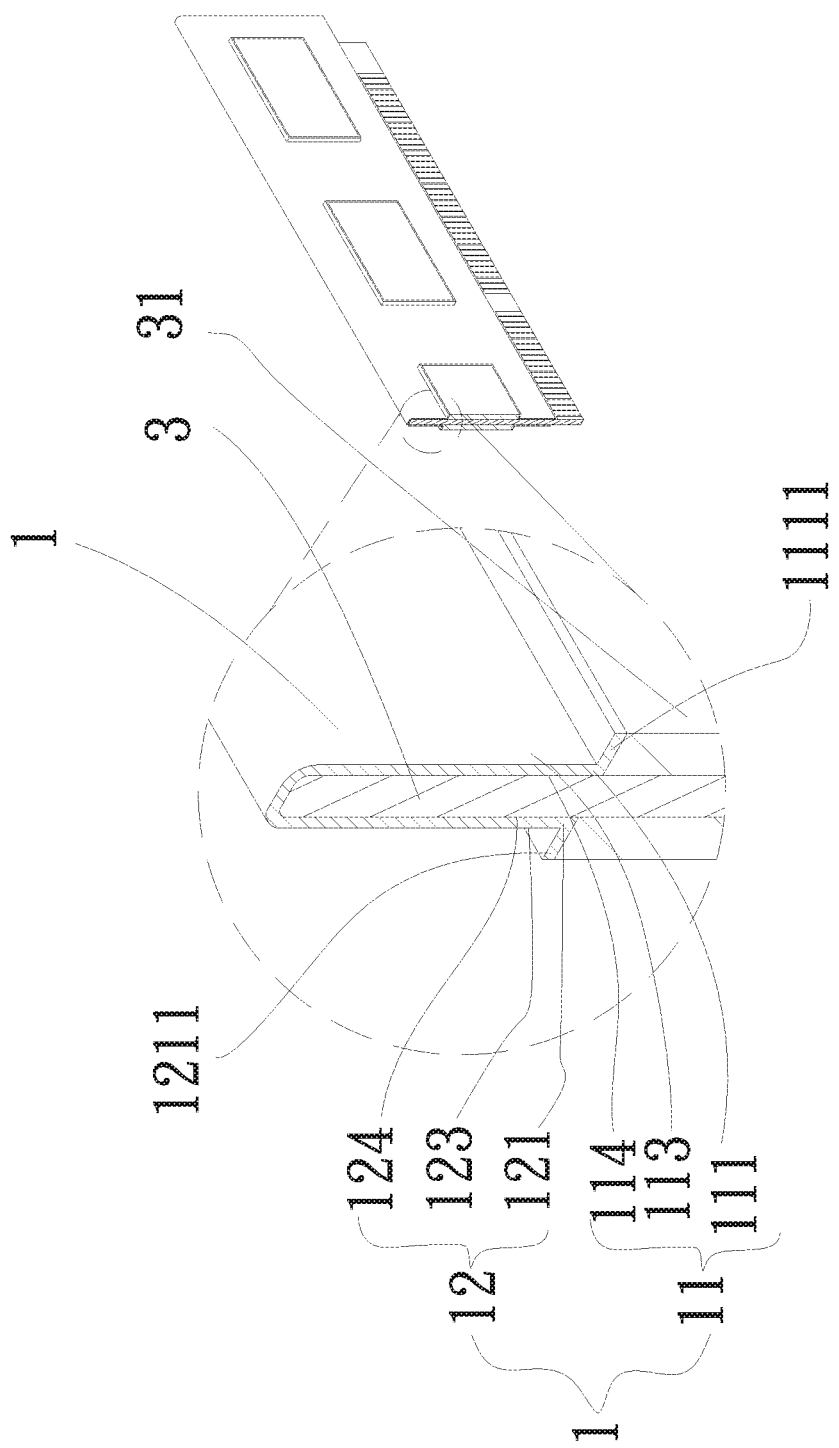
FIG. 5 is a cutaway view of the memory heat dissipation unit of the present invention according to a second variation of the third embodiment thereof.

According to the second variation of the third embodiment of the memory heat dissipation unit as shown in FIG. 5, an outward protruded first flange section 1111 and an outward protruded second flange section 1211 can be further formed around each of the openings of the first and the second heat-receiving sections 111, 121, respectively. The first and the second flange sections 1111, 1211 are in direct contact with outer peripheral surfaces of the chips 31 to transfer heat produced by the chips 31 to the main body 1, so that the chips 31 are cooled through heat exchange with the main body 1.

Figure 5A:
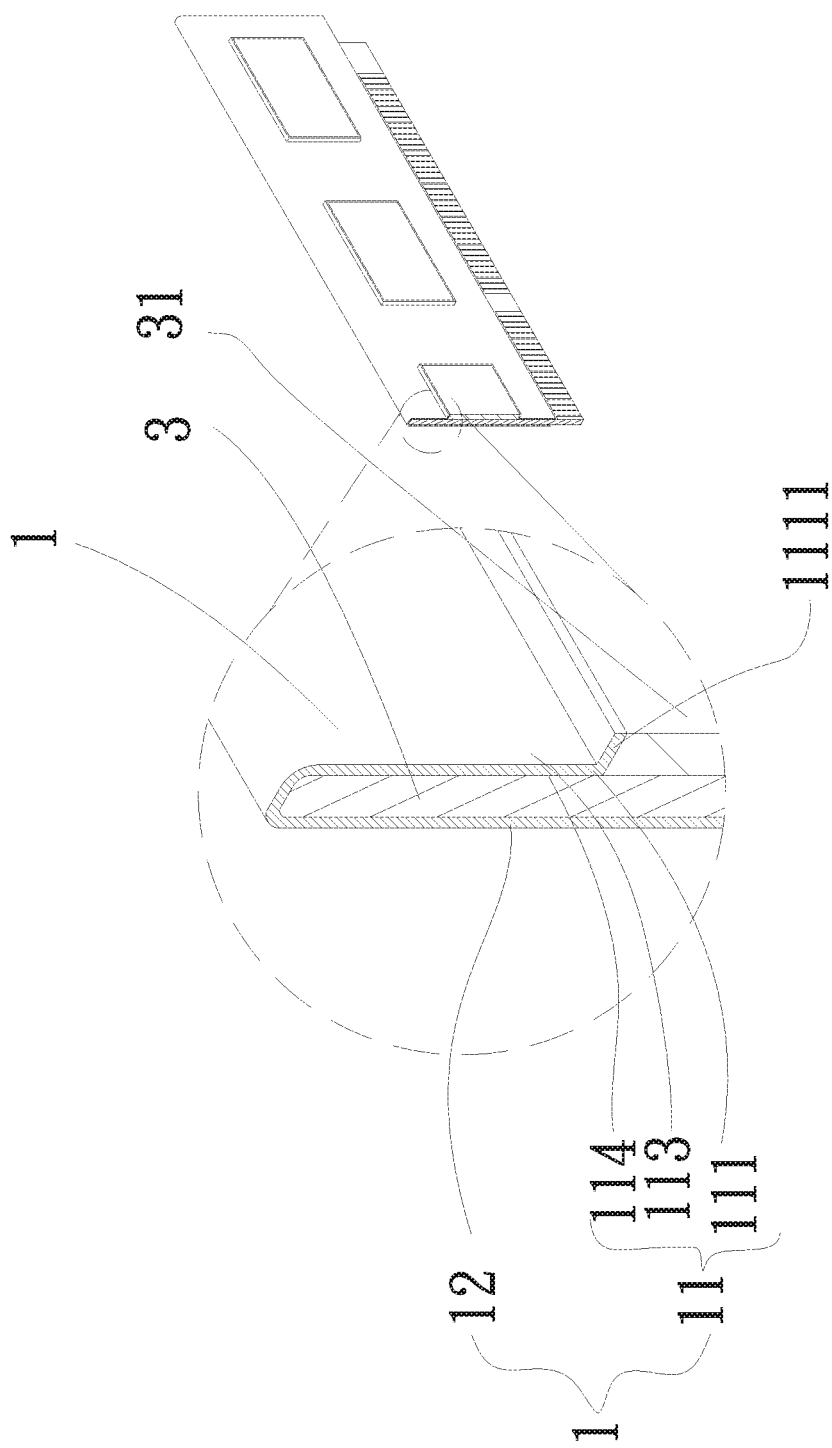
FIG. 5a is a cutaway view of the memory heat dissipation unit of the present invention according to a third variation of the third embodiment thereof.

According to the third variation of the third embodiment of the memory heat dissipation unit as shown in FIG. 5a, the heat-receiving sections with flange sections can be provided on only one of the first and the second portion 11, 12. In FIG. 5a, the third variation is illustrated to have the first heat-receiving sections 111 and the first flange sections 1111 provided on the first portion 11.

Figure 5B:
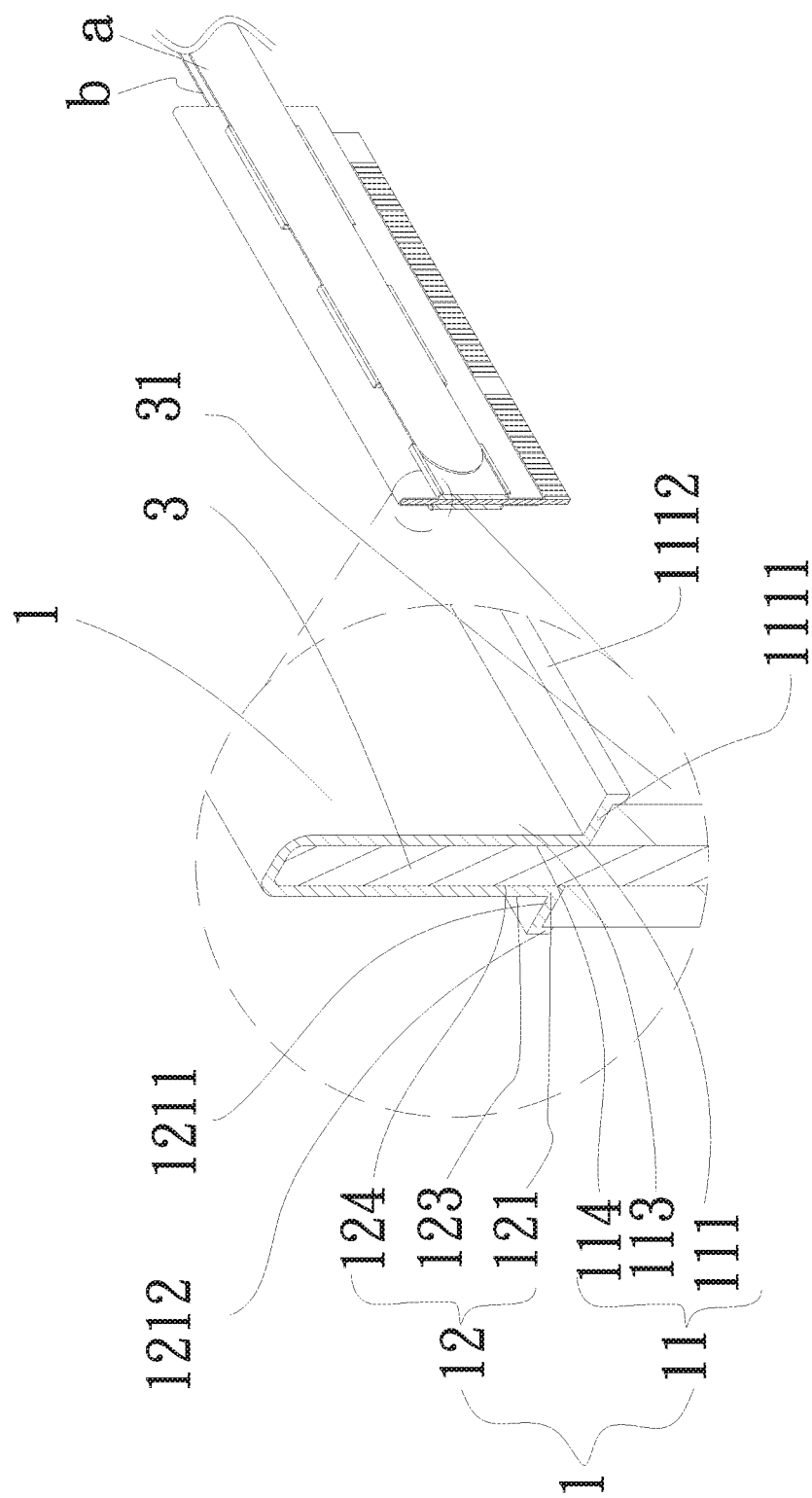
FIG. 5b is a cutaway view of the memory heat dissipation unit of the present invention according to a fourth variation of the third embodiment thereof.

According to the fourth variation of the third embodiment of the memory heat dissipation unit as shown in FIG. 5b, the first and/or the second flange sections 1111, 1211 can be respectively provided along their free edges with a first and a second lip section 1112, 1212, respectively. The first and the second lip sections 1112, 1212 are extended perpendicular to the first and the second flange sections 1111, 1211, respectively, toward central areas of the openings of the first and the second heat-receiving sections 111, 121, and are in contact with a part of the outer surfaces of the chips 31 that are exposed from the main body 1 via the openings of the first and the second heat-receiving sections 111, 121. Further, at least one first heat-transfer element a and at least one second heat-transfer element b can be provided for directly contacting with remaining outer surfaces of the chips 31 that are not covered by the first and the second lip sections 1112, 1212, so as to exchange heat with the chips 31.

According to the fifth variation of the third embodiment of the memory heat dissipation unit as shown in FIG. 5c, the heat-receiving sections with flange sections, lip sections and heat-transfer element can be provided on only one of the first and the second portion 11, 12. In FIG. 5c, the fifth variation is illustrated to have the first heat-receiving sections 111, the first flange sections 1111, the first lip sections 1112 and the first heat-transfer element a provided on the first portion 11.

Figure 6:
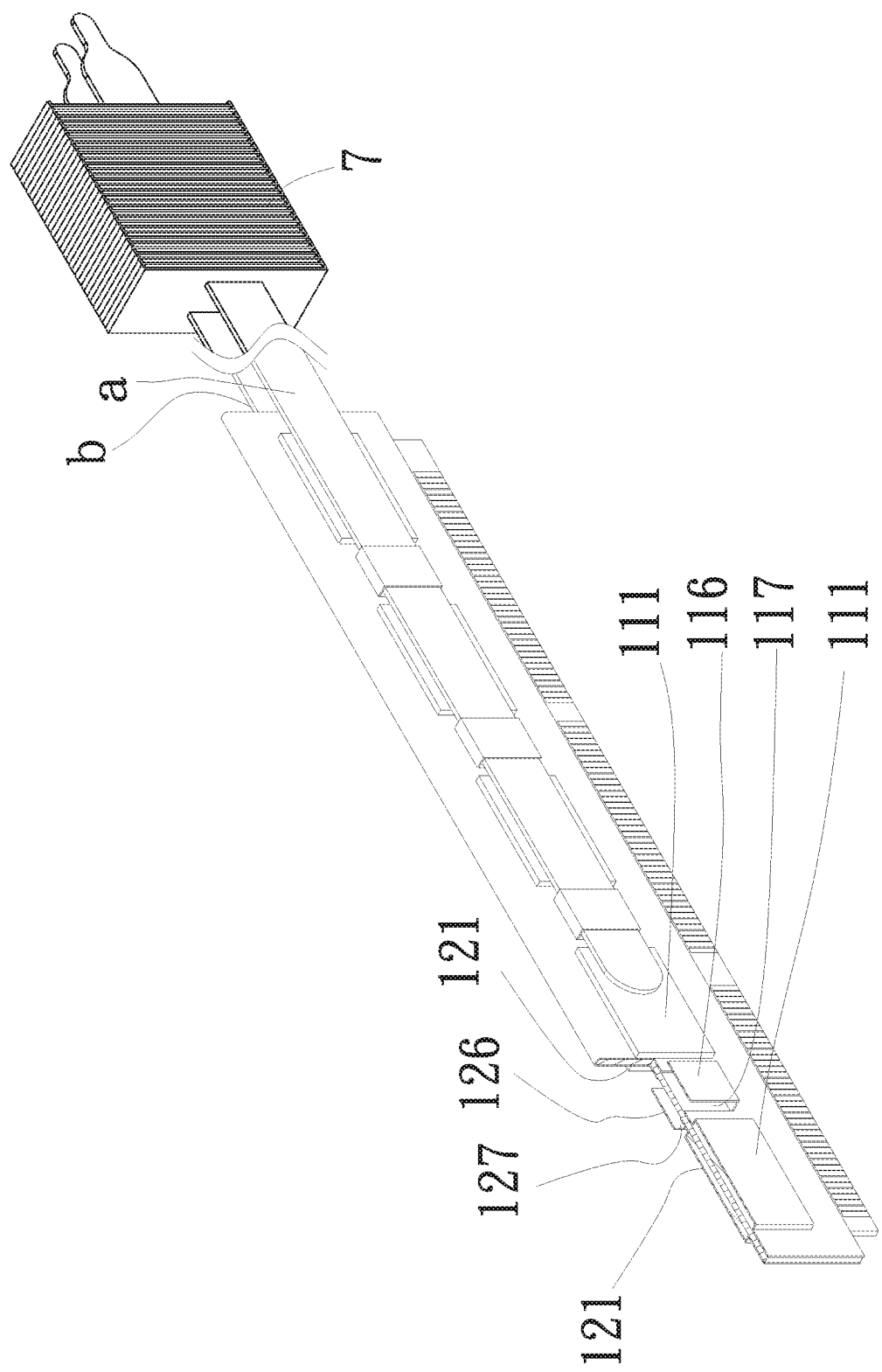
FIG. 6 is a cutaway view of a fourth embodiment of the memory heat dissipation unit according to the present invention.
Figure 7:
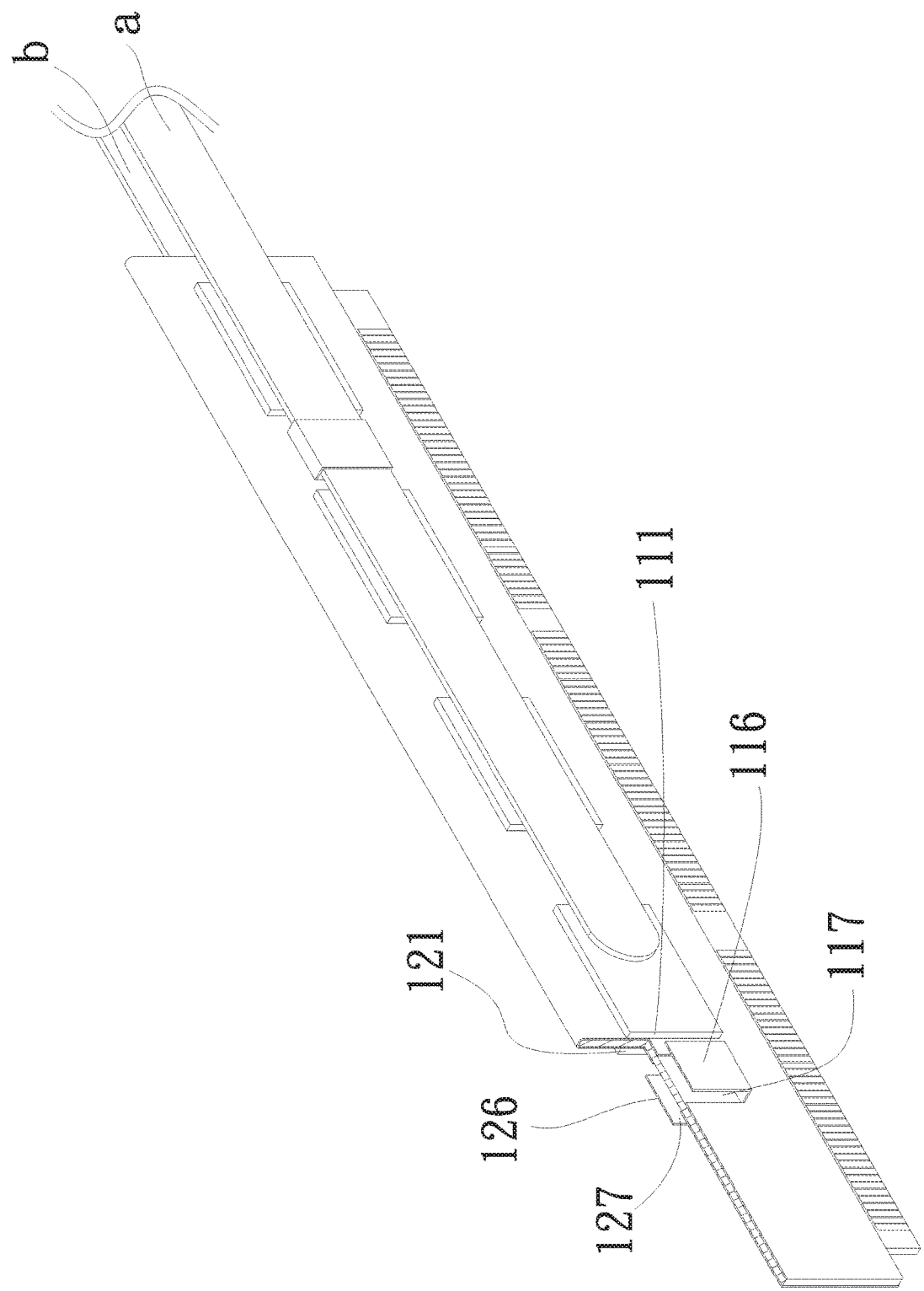
FIG. 7 is a cutaway view of the memory heat dissipation unit of the present invention according to a second variation of the fourth embodiment thereof.
Figure 7A:
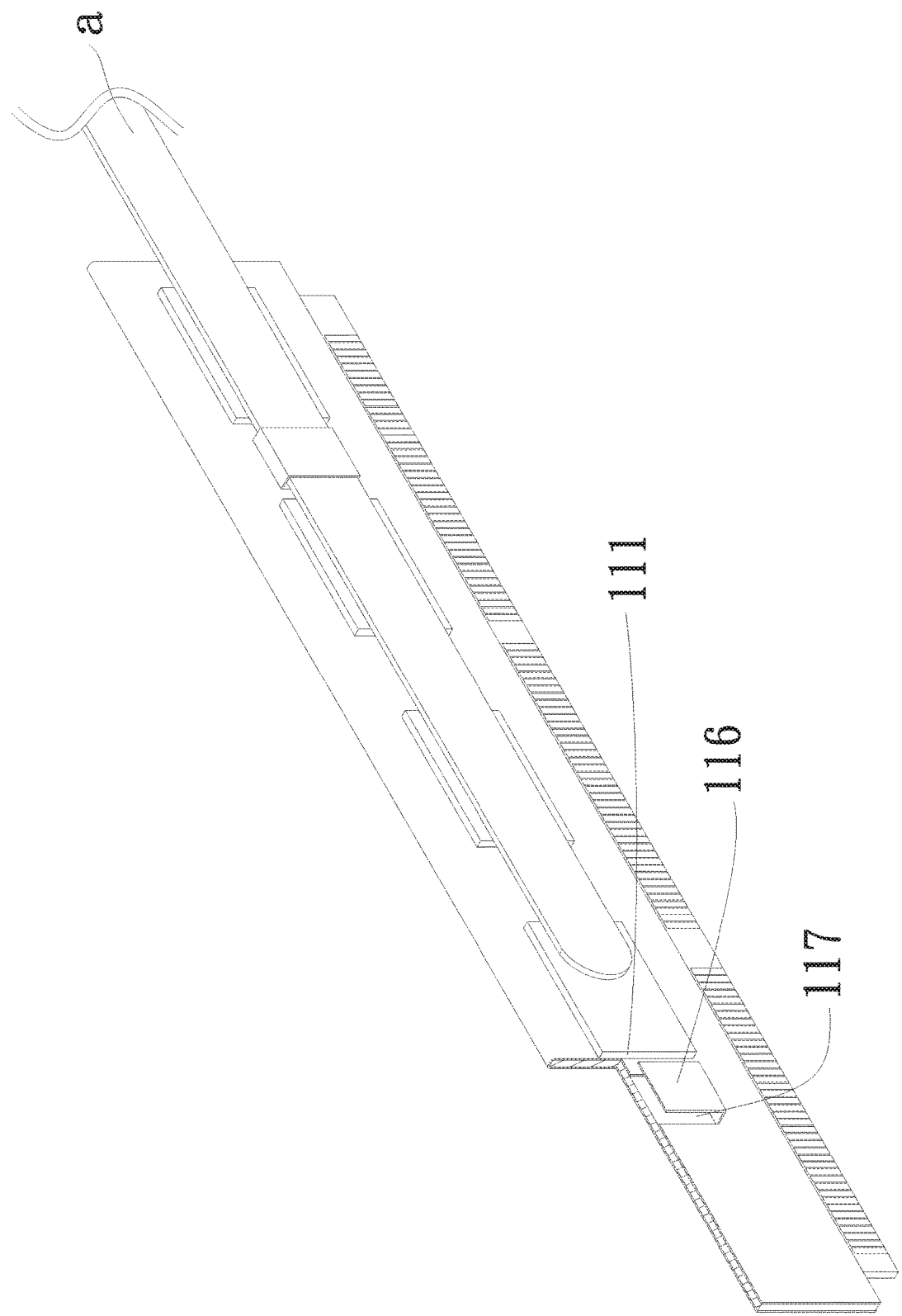
FIG. 7a is a cutaway view of the memory heat dissipation unit of the present invention according to a third variation of the fourth embodiment thereof.

Please refer to FIG. 6, which is a cutaway view of a fourth embodiment of the memory heat dissipation unit according to the present invention; and to FIGS. 6a, 7 and 7a, which sequentially show first, second and third variations of the fourth embodiment of the memory heat dissipation unit. As shown, the fourth embodiment of the memory heat dissipation unit is different from the first embodiment in further including a plurality of first holding sections 116, a plurality of second holding sections 126, a first heat-transfer element a, a second heat-transfer element b, and a heat dissipation element 7.

According to the fourth embodiment, the first holding sections 116 are respectively located between any two adjacent ones of the mutually spaced first heat-receiving sections 111, and the second holding sections 126 are respectively located at any two adjacent ones of the mutually spaced second heat-receiving sections 121. According to the second variation of the fourth embodiment shown in FIG. 7, the first holding sections 116 are arranged only at locations before the first one and after the last one of the first heat-receiving sections 111 on the main body 1; and the second holding sections 126 can be arranged only at locations before the first one and after the last one of the second heat-receiving sections 121 on the main body 1. Or, in other operable embodiments, the first holding sections 116 and the second holding sections 126 can be arranged on the first portion 11 and the second portion 12 of the main body 1, respectively, at other suitable positions without any particular limitation. Each of the first holding sections 116 internally defines a first passage 117, and each of the second holding sections 126 internally defines a second passage 127. The first heat-transfer element a is transversely extended across the first passages 117 defined in the first holding sections 116; and the second heat-transfer element b is transversely extended across the second passages 127 defined in the second holding sections 126. The first and the second heat-transfer element a, b respectively have a pipe body in contact with the first and the second heat-receiving sections 111, 121 to enable heat transfer from the first and second heat-receiving sections 111, 121 to the first and second heat-transfer elements a, b, respectively. The heat dissipation element 7 is connected to an end of the first and of the second heat-transfer element a, b that are extended beyond the main body 1 and located further away the first and the second holding sections 116, 126. The heat dissipation element 7 can be a radiating-fin assembly, a heat sink, a water block or a heat exchanger. In the fourth embodiment illustrated in FIG. 6, the heat dissipation element 7 is a heat sink.

According to the first and the third variation of the fourth embodiment of the memory heat dissipation unit, the heat-receiving sections, the holding sections and the heat-transfer elements can be provided on only one of the first and the second portion 11, 12. In FIGS. 6a and 7a, the first and the third variation of the fourth embodiment are illustrated to have the first heat-receiving sections 111, the first holding sections 116 and the first heat-transfer element a provided on the first portion 11.

According to the fourth embodiment, the first and the second heat-transfer element a, b both have at least one flat side for directly contacting with the first and the second heat-receiving sections 111, 121, respectively, for heat exchange. The first and the second heat-transfer element a, b can be respectively a D-sectioned pipe, a flat pipe or a plate-type heat pipe, which includes a flat surface for direct contact with the first and second heat-receiving sections 111, 121 or with the chips 31 of the memory 3.

Figure 8:
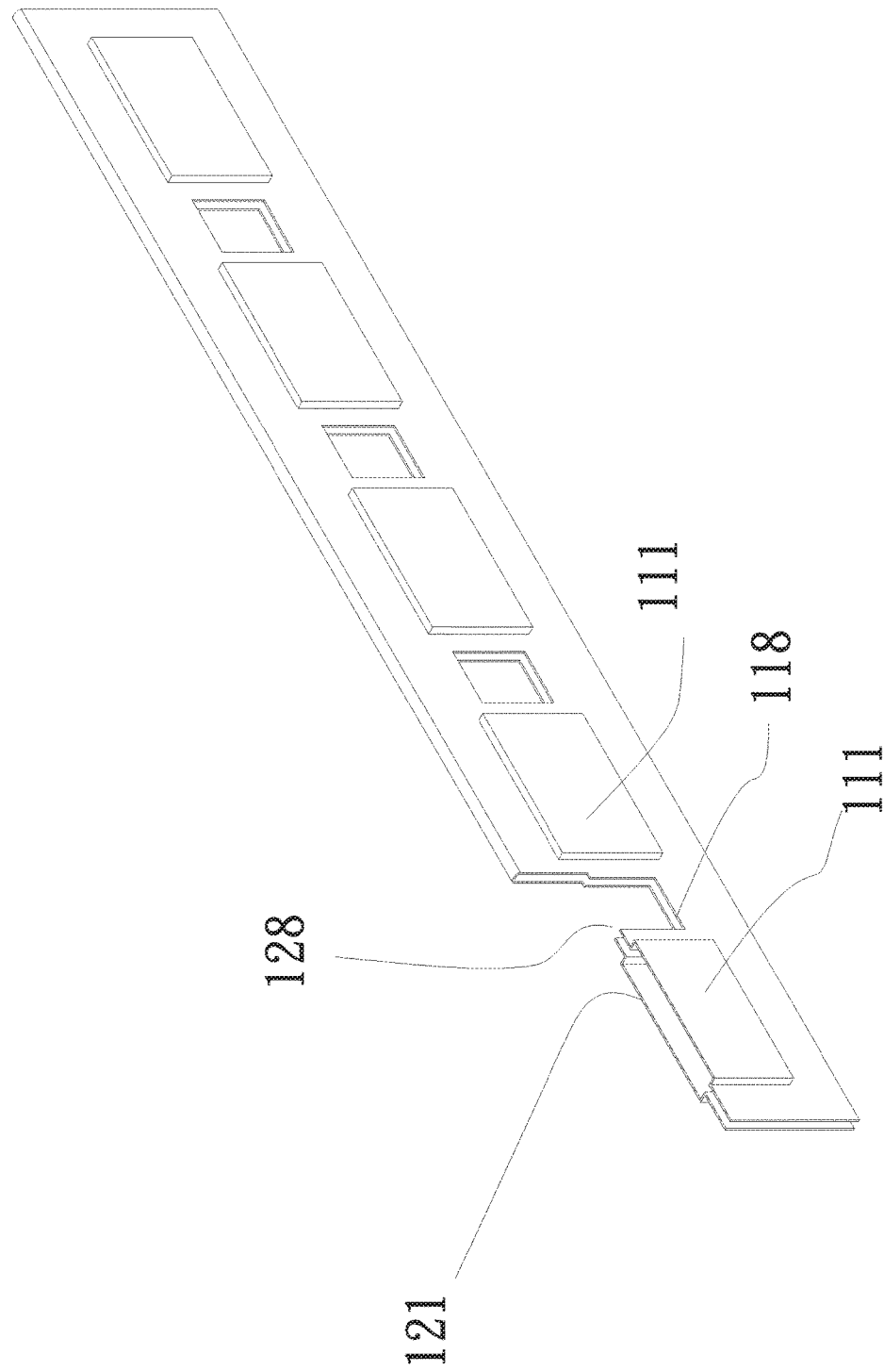
FIG. 8 is a cutaway view of a fifth embodiment of the memory heat dissipation unit according to the present invention.
Figure 8A:
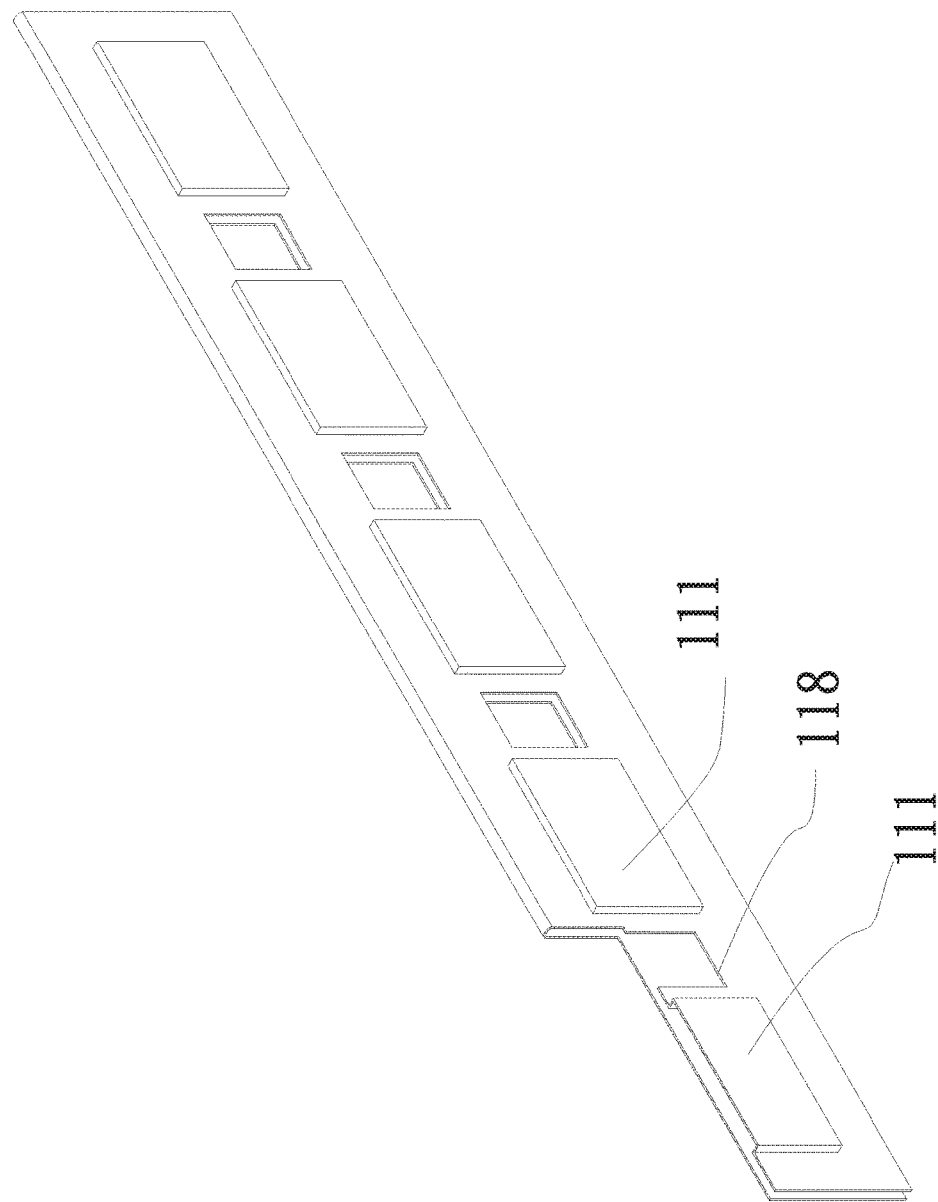
FIG. 8a is a cutaway view of the memory heat dissipation unit of the present invention according to a first variation of the fifth embodiment thereof.

Please refer to FIGS. 8 and 8a, which are cutaway views of a fifth embodiment and a first variation thereof, respectively, of the memory heat dissipation unit according to the present invention. As shown, the fifth embodiment of the memory heat dissipation unit is different from the first embodiment in further including a plurality of first air vents 118 respectively formed on the first portion 11 between any two adjacent ones of the mutually spaced first heat-receiving sections 111, and a plurality of second air vents 128 respectively formed on the second portion 12 between any two adjacent ones of the mutually spaced second heat-receiving section 121. Alternatively, the first and the second air vents 118, 128 can be formed on the first and the second portion 11, 12, respectively, at locations outside the first and the second heat-receiving sections 111, 121. The first and the second air vents 118, 128 are provided to enable increased flow efficiency of heat-carrying air and accordingly, quicker dissipation of heat from the main body 1 into ambient air.

According to the first variation of the fifth embodiment of the memory heat dissipation unit as shown in FIG. 8a, the heat-receiving sections and the air vents can be provided on only one of the first and the second portion 11, 12. In FIG. 8a, the first variation is illustrated to have the first heat-receiving sections 111 and the first air vents 118 provided on the first portion 11.

Figure 9A:
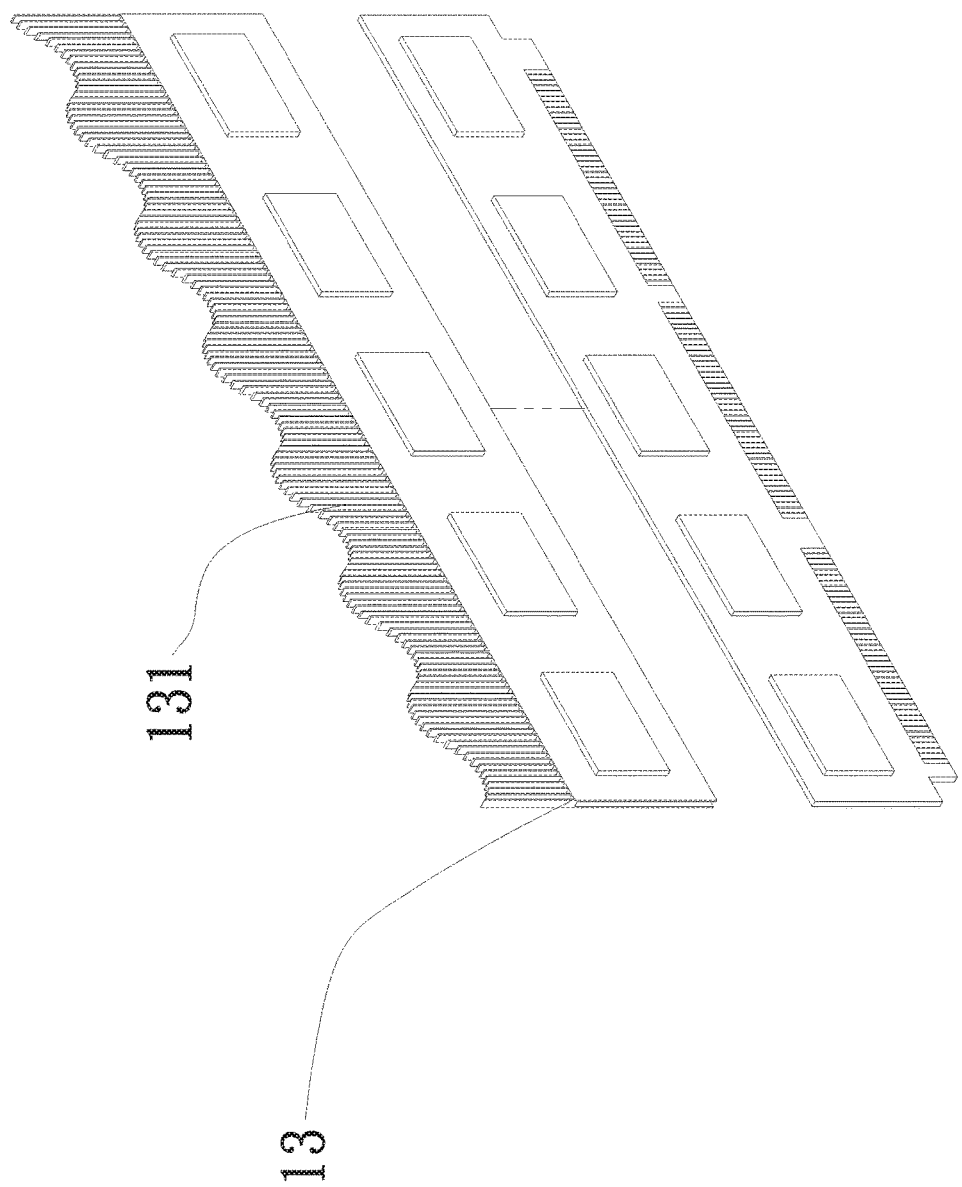
FIG. 9a is an exploded perspective view of a sixth embodiment of the memory heat dissipation unit according to the present invention.
Figure 9B:
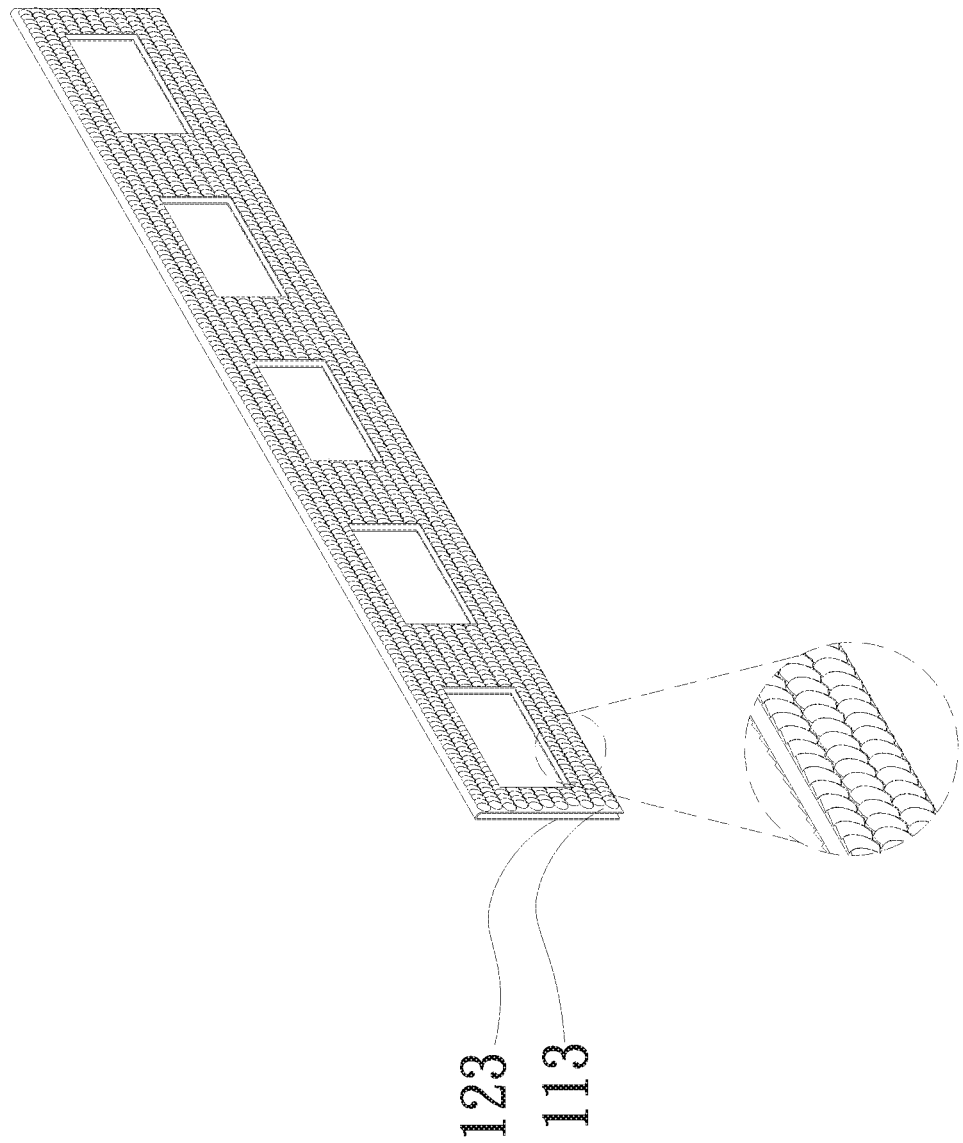
FIG. 9b is an assembled perspective view of the memory heat dissipation unit of the present invention according to a first variation of the sixth embodiment thereof.

Please refer to FIG. 9a, which is an exploded perspective view of a sixth embodiment of the memory heat dissipation unit according to the present invention, and to FIG. 9b, which is an assembled perspective view of a first variation of the sixth embodiment of the memory heat dissipation unit. As shown, the sixth embodiment of the memory heat dissipation unit is different from the first embodiment in further including at least one type of external structure additionally provided on all or part of the outer surfaces of the main body 1. The additional external structure can consist of, for example, a plurality of protrusions or depressions formed on the main body 1 by shot peening, a plurality of slots, slits or chinks formed on the main body by stamping, a roughened surface formed on the main body 1 by sandblasting, or a plurality of plate-fins or pin-fins formed on the main body 1 by milling or stamping. In the sixth embodiment shown in FIG. 9a, the additional external structure includes a plurality of plate-fins 131 formed on a top surface of the connection portion 13 of the main body 1. In the first variation of the sixth embodiment shown in FIG. 9b, the additional external structure includes a plurality of sequentially arrayed recesses and protrusions provided on the first and the second outer surface 113, 123 of the main body 1. The above-illustrated additionally provided external structures give the outer surfaces of the main body 1 largely increased heat dissipation areas for heat dissipation by radiation and accordingly, enable the memory heat dissipation unit of the present invention to have upgraded overall heat dissipation efficiency. These external structures showing different surface configurations also give the memory heat dissipation unit of the present invention esthetic appearances and designs.

Figure 10A:
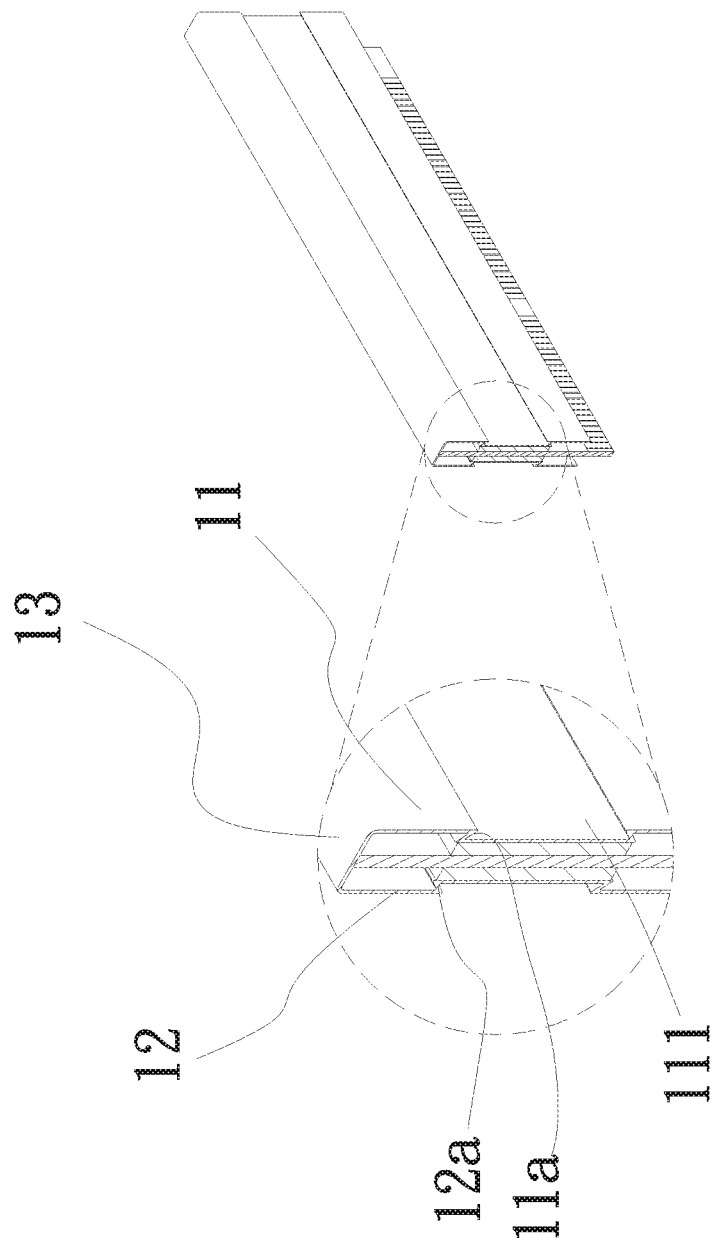
FIG. 10a is a cutaway view of a seventh embodiment of the memory heat dissipation unit according to the present invention.

Please refer to FIG. 10a, which is a cutaway view of a seventh embodiment of the memory heat dissipation unit according to the present invention, and to FIGS. 10b to 10f, which are cutaway views sequentially show a first to a fifth variation, respectively, of the seventh embodiment of the memory heat dissipation unit. It is noted the structural and technical features of the seventh embodiment and the variations thereof can be applied to or combined with the memory heat dissipation units according to the first to the sixth embodiment and their variations. As shown in FIG. 10a, the seventh embodiment is generally structurally similar to the previous first to sixth embodiments but further includes a first acute-angled bent section 11a formed along a joint line between the first portion 11 and the first heat-receiving section 111 and a second acute-angled bent section 12a formed along a joint line between the second portion 12 and the second heat-receiving section 121. More specifically, the first and the second acute-angled bent section 11a, 12a respectively form an upper edge of the first and the second heat-receiving section 111, 121 and are faced outward relative to the first and the second portion 11, 12, respectively, to give the first and the second portion 11, 12 an increased inward clipping force while allow the first and the second portion 11, 12 to maintain parallel to each other.

Figure 10B:
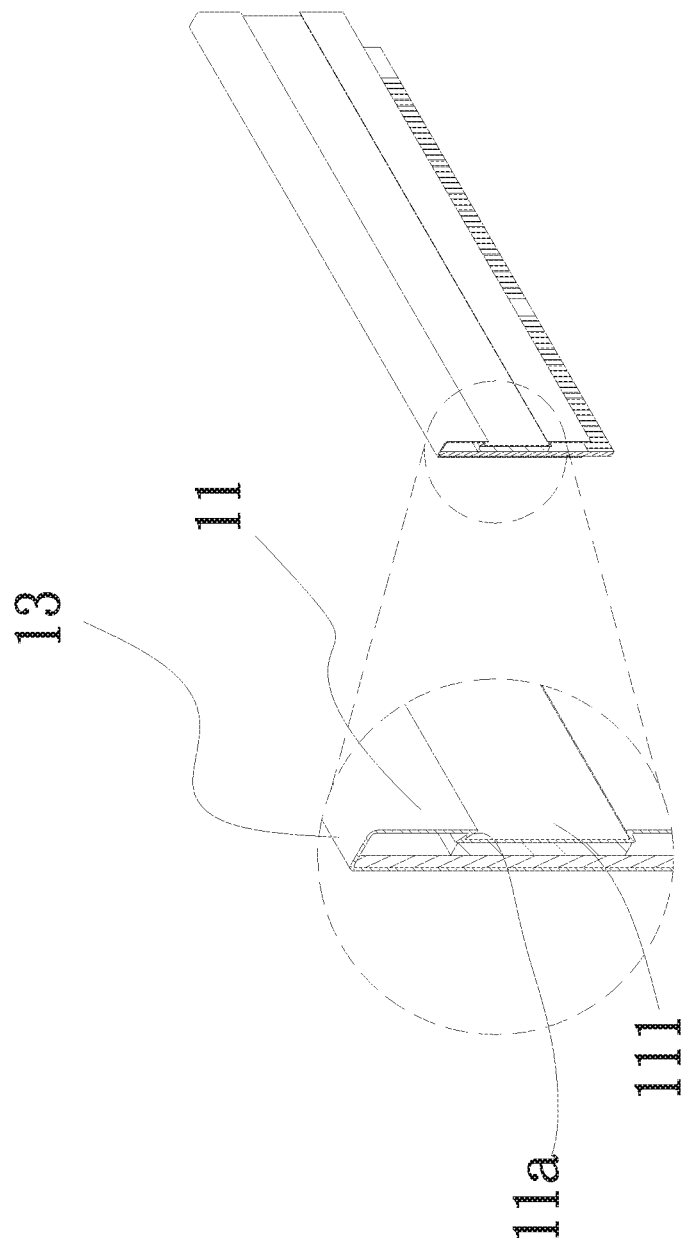
FIG. 10b is a cutaway view of the memory heat dissipation unit of the present invention according to a first variation of the seventh embodiment thereof.

According to the first variation of the seventh embodiment of the memory heat dissipation unit, the heat-receiving sections and the acute-angled bent sections can be provided on only one of the first and the second portion 11, 12. In FIG. 10b, the first variation is illustrated to have the first heat-receiving section 111 and the first acute-angled bent section 11a provided on the first portion 11.

Figure 10C:
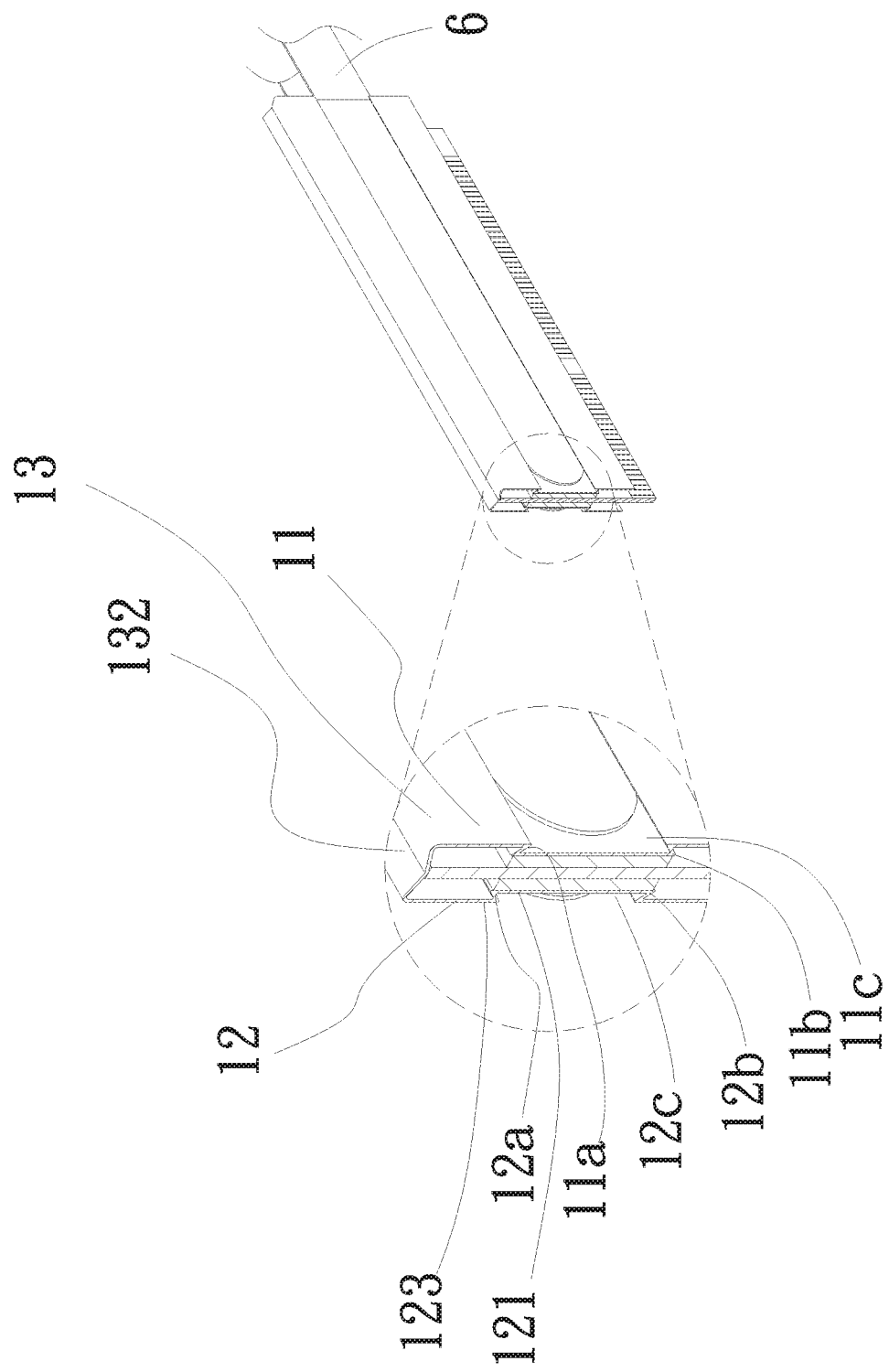
FIG. 10c is a cutaway view of the memory heat dissipation unit of the present invention according to a second variation of the seventh embodiment thereof.

The second variation of the seventh embodiment of the memory heat dissipation unit shown in FIG. 10c is different from the seventh embodiment shown in FIG. 10a in further including a third acute-angled bent section 11b formed along a lower edge of the first heat-receiving section 111, a fourth acute-angled bent section 12b formed along a lower edge of the second heat-receiving section 121, and a downward bent section 132 formed on a top of the connection portion 13. Similar to the first and the second acute-angled bent section 11a, 12a, the third and the fourth acute-angled bent section 11b, 12b are faced outward relative to the first and the second portion 11, 12, respectively. The downward bent section 132 provides an elastically deformable space, which allows the main body 1 to elastically deform by a certain amount. The first and the third acute-angled bent section 11a, 11b together define a first clamping space 11c on the first outer surface 113, and the second and the fourth acute-angled bent section 12a, 12b together define a second clamping space 12c on the second outer surface 123. A thermal conductive unit 6, such as a heat pipe, a vapor chamber, a metal thermal conducting member or a water block, can be fitted in each of the first and the second clamping space 11c, 12c by means of interference fit. Heat produced by the chips 31 is transferred by the thermal conductive units 6 to a remote location for dissipating into ambient air. In the second variation of the seventh embodiment shown in FIG. 10c, the thermal conductive units 6 are heat pipes without being limited thereto.

Figure 10D:
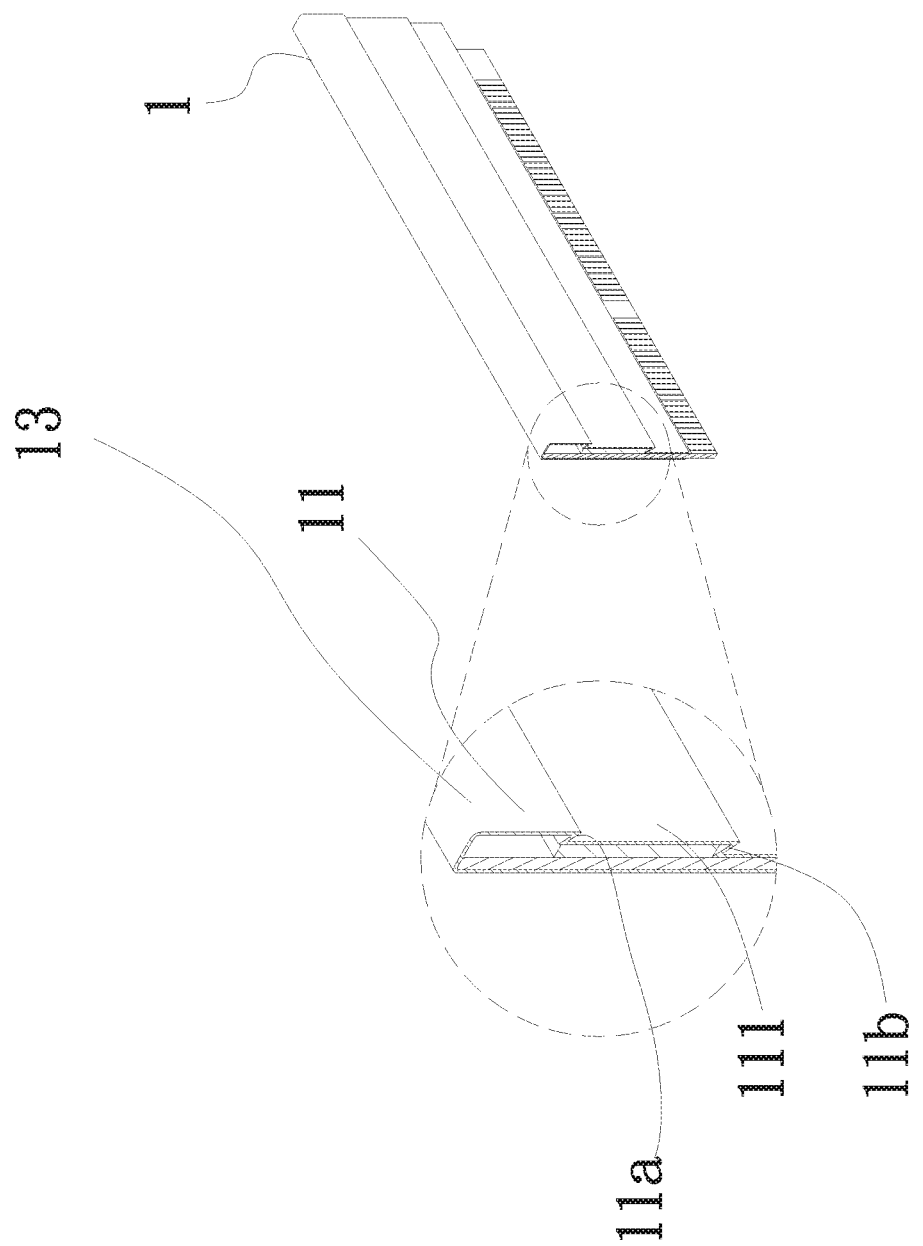
FIG. 10d is a cutaway view of the memory heat dissipation unit of the present invention according to a third variation of the seventh embodiment thereof.

According to the third variation of the seventh embodiment of the memory heat dissipation unit, the heat-receiving sections and the acute-angled bent sections can be provided on only one of the first and the second portion 11, 12. In FIG. 10d, the third variation of the seventh embodiment is illustrated to have the first heat-receiving section 111 and the first and third acute-angled bent sections 11a, 11b provided on the first portion 11.

Figure 10E:
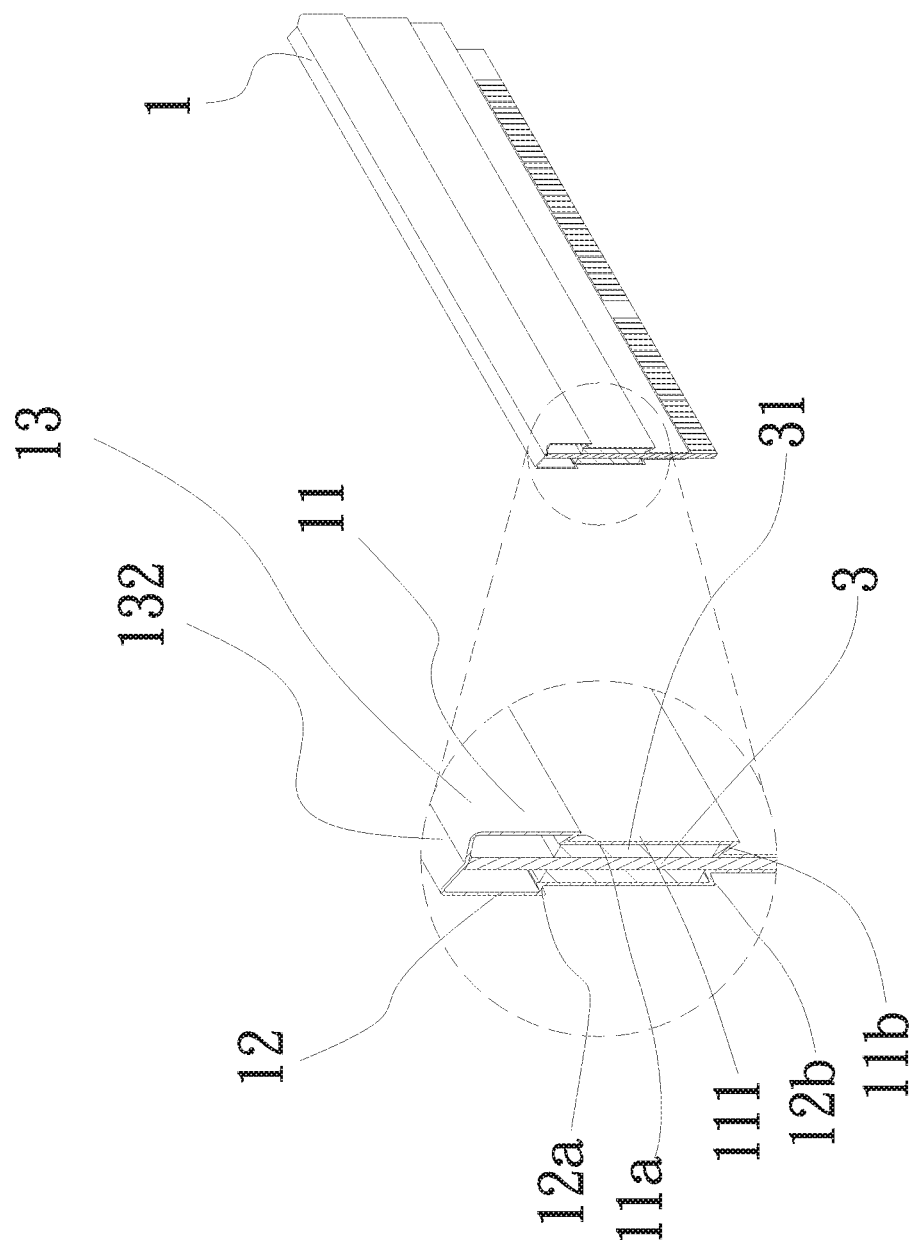
FIG. 10e is a cutaway view of the memory heat dissipation unit of the present invention according to a fourth variation of the seventh embodiment thereof.

The fourth variation of the seventh embodiment shown in FIG. 10e is different from the first variation of the seventh embodiment in that the third and the fourth acute-angled bent section 11b, 12b are faced inward relative to the first and the second portion 11, 12, respectively, to enable an enhanced clipping force of the first and the second heat-receiving section 111, 121 against the chips 31.

Figure 10F:
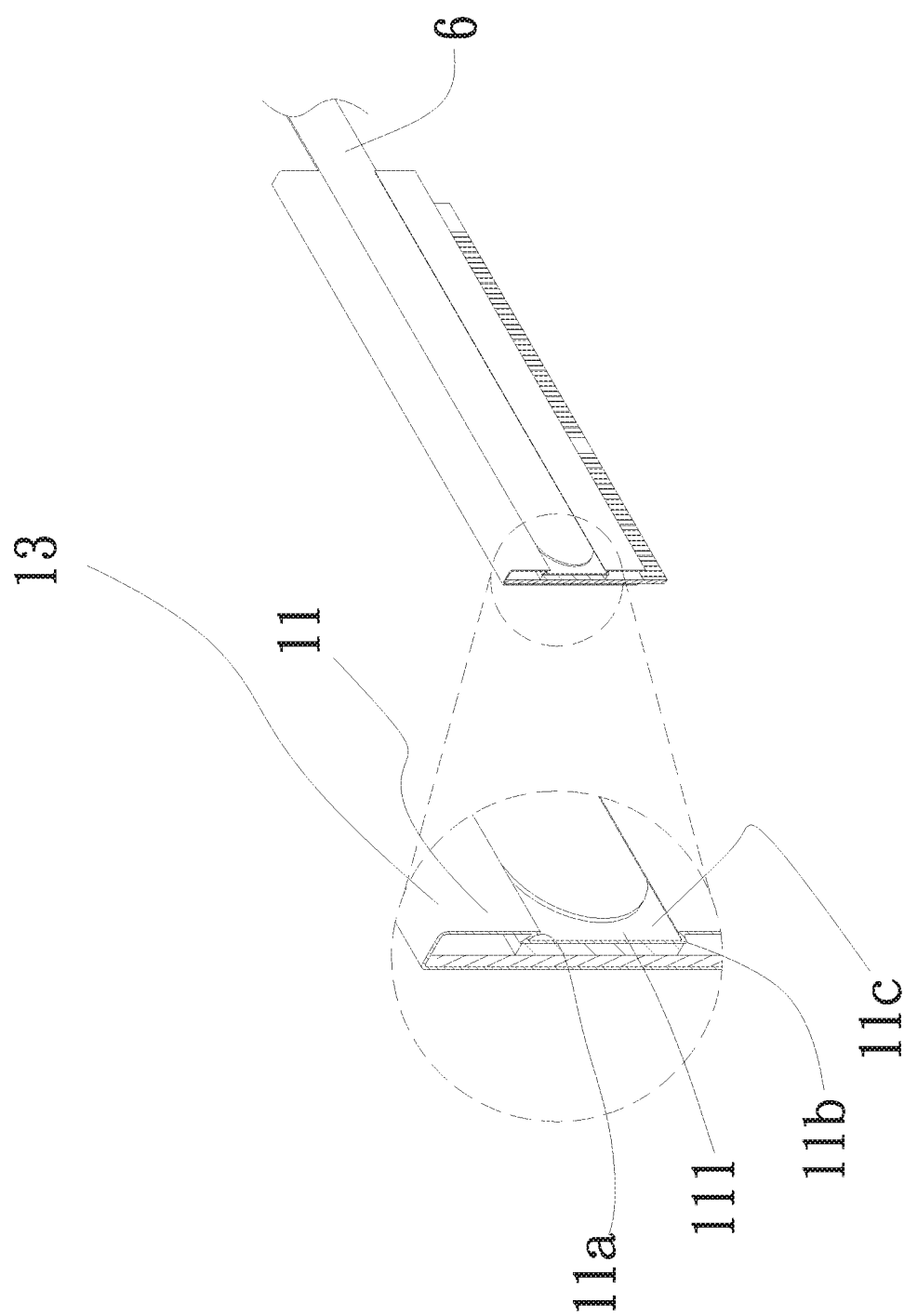
FIG. 10f is a cutaway view of the memory heat dissipation unit of the present invention according to a fifth variation of the seventh embodiment thereof.

According to the fifth variation of the seventh embodiment of the memory heat dissipation unit, the heat-receiving sections, the acute-angled bent sections and the thermal conductive units can be provided on only one of the first and the second portion 11, 12. In FIG. 10f, the fifth variation is illustrated to have the first heat-receiving section 111, the first and third acute-angled bent section 11a, 11b and one thermal conductive unit 6 provided on the first portion 11.

The features of the seventh embodiment and the variations thereof can be applied to or combined with any of the memory heat dissipation units according to the first to the sixth embodiment and their variations.

Figure 11:
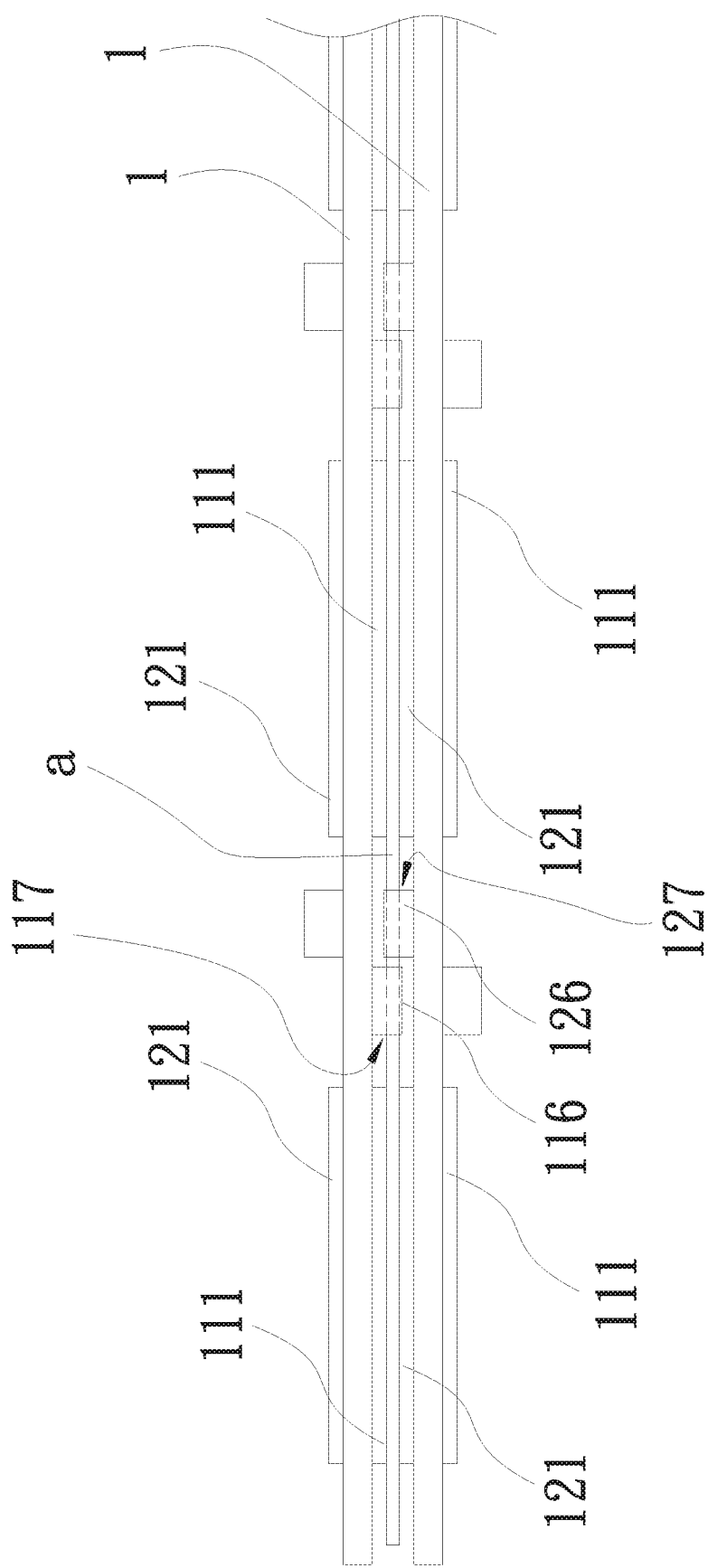
FIG. 11 is an assembled top view of an eighth embodiment of the memory heat dissipation unit according to the present invention.
Figure 12:
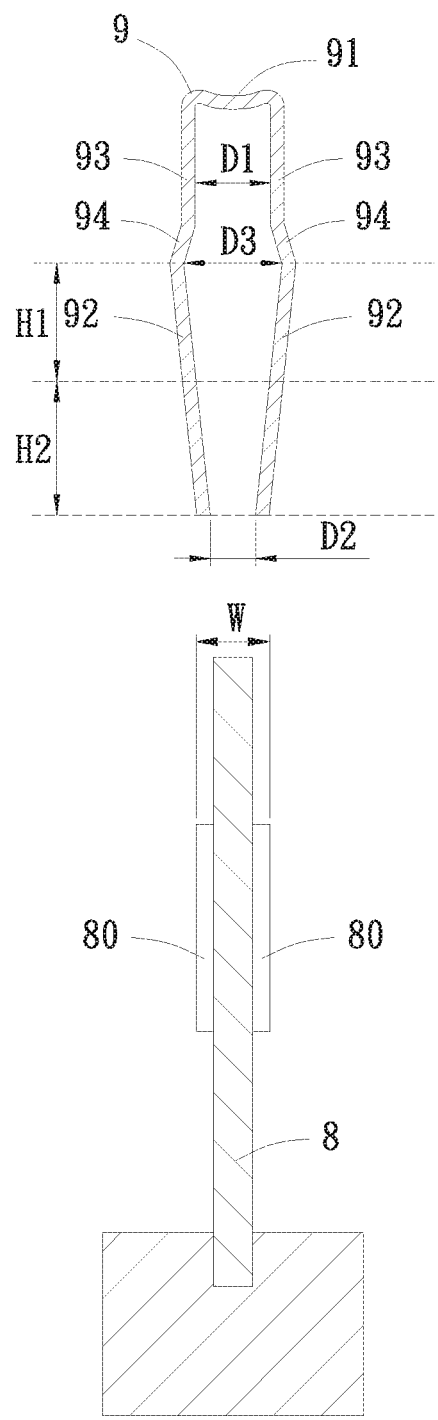
FIG. 12 schematically shows a first conventional memory heat dissipation unit.
Figure 13:
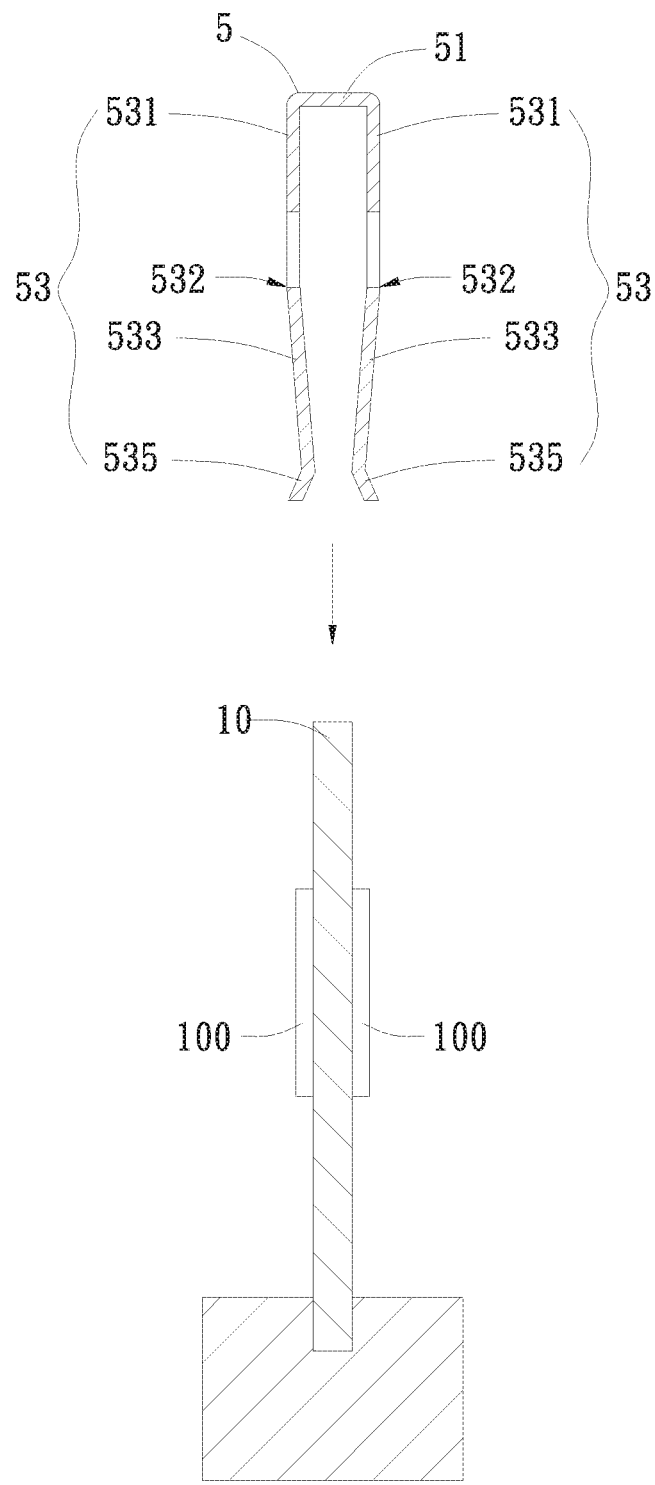
FIG. 13 schematically shows a second conventional memory heat dissipation unit.

Please refer to FIG. 11 that is an assembled top view of an eighth embodiment of the memory heat dissipation unit according to the present invention. As shown, the eighth embodiment is different from the fourth embodiment and the variations thereof shown in FIGS. 6, 6a, 7 and 7a in having two main bodies 1 coupled with each other via one common piece of first heat-transfer element a that is transversely extended across the first holding sections 116 on one main body 1 and the second holding sections 126 on the other main body 1 at the same time. More specifically, according to the eighth embodiment of the memory heat dissipation unit, the two main bodies 1 are so arranged that the first portion 11 of one of the two main bodies 1 faces toward the second portion 12 of the other main body 1; and the two main bodies 1 respectively have a plurality of first holding sections 116 and a plurality of second holding sections 126 correspondingly provided on their first portion 11 and second portion 12 in pairs. The pairs of first and second holding sections 116, 126 on one of the two main bodies 1 are located offset from the pairs of first and second holding sections 116, 126 on the other main body 1, such that the first holding sections 116 and the second holding sections 126 provided on the facing first portion 11 and second portion 12 of the two main bodies 1, respectively, are located at the same line between the two main bodies 1 and linearly communicable with one another, allowing a common piece of first heat-transfer element a to transversely extend across the first passages 117 and the second passages 127 defined in the linearly communicable first and second holding sections 116, 126 to thereby assemble the two adjacent main bodies 1 to one another. That is, heat absorbed by the two main bodies 1 is simultaneously transferred to two opposite side surfaces of the first heat-transfer section a.

In all of the previously described first to eighth embodiments of the memory heat dissipation unit of the present invention and all variations thereof, areas of the first and the second inner surface 114, 124 that form the first and the second heat-receiving sections 111, 121 for contacting with the chips 31 can be respectively provided with a thermal paste, a thermal plate, or other materials with good thermal conductivity (not shown) to enable tight attachment of the first and the second heat-receiving sections 111, 121 to the chips 31 while prevent the occurrence of thermal resistance between the chips 31 and the first and second heat-receiving sections 111, 121. Further, the thermal conductive units 6 can be provided in all of the previously described first to eighth embodiments of the memory heat dissipation unit of the present invention and their variations to be in direct contact with the first and the second heat-receiving sections 111, 121 or the outer surfaces of the chips 31 that are exposed from the openings of the first and the second heat-receiving sections 111, 121 for heat transfer or heat exchange. The thermal conductive element 6 can be a heat pipe, a vapor chamber, a metal thermal conducting member or a water block. While the thermal conductive elements 6 in the illustrated embodiments and variations are heat pipes, it is understood they are not necessarily limited thereto.

The memory heat dissipation unit of the present invention overcomes the disadvantage of the conventional memory heat dissipation devices as being not suitable for mounting in a narrow space. Further, unlike the prior art memory heat dissipation clips that could not be fitly attached to the chips on a memory when being clipped to the memory and accordingly, provide relatively poor heat exchange effect and tend to damage the chips due to an exceeded clipping force applied to the chips, the memory heat dissipation unit of the present invention includes a first and a second portion 11, 12, on which first and second heat-receiving sections 111, 121 are so formed that they are always located parallel to and accordingly, in fully contact with the chips 31 provided on the memory 3. Therefore, the memory heat dissipation unit of the present invention can provide good heat exchange efficiency. The memory heat dissipation unit of the present invention also has the advantage of having a simple structure to enable upgraded heat dissipation performance thereof, prevent the occurrence of system crash due to overheat, and prolong the service life of the memory 3.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A memory heat dissipation unit, comprising:
a main body including a first portion, a second portion and a connection portion having two lateral edges separately connected to the first and the second portions of the main body; the first and the second portions of the main body having at least one first heat-receiving section and at least one second heat-receiving section formed thereon, respectively; the first and the second heat-receiving sections being correspondingly in contact with at least one memory chip each for absorbing and dissipating heat produced by the chips into ambient air;
whereby a first acute-angled bent section is formed along a line joining the first portion and an upper edge of the at least one first heat-receiving section and a second acute-angled bent section is formed along a line joining the second portion and an upper edge of the at least one second heat-receiving section and the first and the second acute-angled bent sections facing outward from the first and second portions respectively.

2. The memory heat dissipation unit as claimed in claim 1, wherein the first portion has a first outer surface and a first inner surface, and the first outer and inner surfaces being correspondingly outwardly expanded at predetermined areas to form the at least one first heat-receiving section; and wherein the second portion has a second outer surface and a second inner surface, and the second outer and inner surfaces being correspondingly outwardly expanded at predetermined areas to form the at least one second heat-receiving section.

3. The memory heat dissipation unit as claimed in claim 1, wherein the first portion has a first outer surface and a first inner surface, and the first outer and inner surfaces being correspondingly inwardly depressed at predetermined areas to form the at least one first heat-receiving section; and wherein the second portion has a second outer surface and a second inner surface, and the second outer and inner surfaces being correspondingly inwardly depressed at predetermined areas to form the at least one second heat-receiving section.

4. The memory heat dissipation unit as claimed in claim 1, wherein the first portion has a first outer surface and a first inner surface, and the first outer and inner surfaces being correspondingly processed at predetermined areas to form at least one opening that penetrates the first portion to form the at least one first heat-receiving section; and wherein the second portion has a second outer surface and a second inner surface, and the second outer and inner surfaces being correspondingly processed at predetermined areas to form at least one opening that penetrates the second portion to form the at least one second heat-receiving section.

5. The memory heat dissipation unit as claimed in claim 1, wherein the first portion has a plurality of first heat-receiving sections spaced thereon, and the second portion has a plurality of second heat-receiving sections spaced thereon; and wherein the first and the second portions are further provided with a plurality of first holding sections and a plurality of second holding sections, respectively; the first holding sections being respectively located between any two adjacent first heat-receiving sections or at a position before the first one of the first heat-receiving sections and a position after the last one of the first heat-receiving sections; the second holding sections being respectively located between any two adjacent second heat-receiving sections or at a position before the first one of the second heat-receiving sections and a position after the last one of the second heat-receiving sections; and each of the first and the second holding sections internally defining a first and a second passage, respectively.

6. The memory heat dissipation unit as claimed in claim 5, further comprising a first heat-transfer element, a second heat-transfer element and a heat dissipation element; the first and the second heat-transfer elements being transversely extended across the first and the second passages defined in the first and the second holding sections, respectively; the heat dissipation element being connected to an end of the first and of the second heat-transfer element that are extended beyond the main body and located further away from the first and the second holding sections; and the heat dissipation element being an element selected from the group consisting of a radiating-fin assembly, a heat sink and a water block.

7. The memory heat dissipation unit as claimed in claim 1, wherein the first portion has a plurality of first heat-receiving sections spaced thereon, and the second portion has a plurality of second heat-receiving sections spaced thereon; and wherein the first and the second portions are further provided with a plurality of first air vents and a plurality of second air vents, respectively; the first air vents being respectively located between any two adjacent first heat-receiving sections or at a position outside the first heat-receiving sections; and the second air vents being respectively located between any two adjacent second heat-receiving sections or at a position outside the second heat-receiving sections.

8. The memory heat dissipation unit as claimed in claim 1, wherein the main body is formed on outer surfaces thereof with an external structure selected from the group consisting of a plurality of depressions, a plurality of slits, a plurality of plate-fins, a plurality of pin-fins and a plurality of roughened areas.

9. The memory heat dissipation unit as claimed in claim 1, wherein a third acute-angled bent section is formed along a line joining the first portion and a lower edge of the at least one first heat-receiving section and a fourth acute-angled bent section is formed along a line joining the second portion and a lower edge of the at least one second heat-receiving section; and the third and the fourth acute-angled bent sections being faced outward relative to the first and the second portions, respectively; the first and the third acute-angled bent sections together defining a first clamping space on the first outer surface, and the second and the fourth acute-angled bent sections together defining a second clamping space on the second outer surface; and each of the first and the second clamping spaces being able to hold a thermal conductive unit therein.

10. The memory heat dissipation unit as claimed in claim 1, wherein a third acute-angled bent section is formed along a line joining the first portion and a lower edge of the at least one first heat-receiving section and a fourth acute-angled bent section is formed along a line joining the second portion and a lower edge of the at least one second heat-receiving section; and the third and the fourth acute-angled bent sections being faced inward relative to the first and the second portions, respectively.

11. The memory heat dissipation unit as claimed in claim 1, wherein a first included angle is defined between the first portion and the connection portion, and a second included angle is defined between the second portion and the connection portion; and both of the first and the second included angles being smaller than or equal to 90°.

12. A memory heat dissipation unit, comprising:
a main body including a first portion, a second portion and a connection portion having two lateral edges separately connected to the first and the second portions to form an integrated structure; the first and the second portions being parallel to each other; one of the first and the second portions having at least one first heat-receiving section formed thereon; the at least one first heat-receiving section being in contact with at least one memory chip for absorbing and dissipating heat produced by the chip into ambient air;
wherein a first acute-angled bent section is defined along a line joining the first portion and an upper edge of the at least one first heat-receiving section, said first acute-angled bent section facing outward relative to the first and second portions.

13. The memory heat dissipation unit as claimed in claim 12, wherein the first portion has a first outer surface and a first inner surface, and the first outer and inner surfaces being correspondingly outwardly expanded at predetermined areas to form the at least one first heat-receiving section.

14. The memory heat dissipation unit as claimed in claim 12, wherein the first portion has a first outer surface and a first inner surface, and the first outer and inner surfaces being correspondingly inwardly depressed at predetermined areas to form the at least one first heat-receiving section.

15. The memory heat dissipation unit as claimed in claim 12, wherein the first portion has a first outer surface and a first inner surface, and the first outer and inner surfaces being correspondingly processed at predetermined areas to form at least one opening that penetrates the first portion to form the at least one first heat-receiving section.

16. The memory heat dissipation unit as claimed in claim 12, wherein the first portion has a plurality of first heat-receiving sections spaced thereon and is further provided with a plurality of first holding sections; the first holding sections being respectively located between any two adjacent first heat-receiving sections or at a position before the first one of the first heat-receiving sections and a position after the last one of the first heat-receiving sections; and each of the first holding sections internally defining a first passage.

17. The memory heat dissipation unit as claimed in claim 16, further comprising a first heat-transfer element and a heat dissipation element; the first heat-transfer element being transversely extended across the first passages defined in the first holding sections; the heat dissipation element being connected to an end of the first heat-transfer element that is extended beyond the main body and located further away from the first holding sections; and the heat dissipation element being an element selected from the group consisting of a radiating-fin assembly, a heat sink and a water block.

18. The memory heat dissipation unit as claimed in claim 12, wherein the first portion has a plurality of first heat-receiving sections spaced thereon, and wherein the first portion is further provided with a plurality of first air vents; the first air vents being respectively located between any two adjacent first heat-receiving sections or at a position outside the first heat-receiving sections.

19. The memory heat dissipation unit as claimed in claim 12, wherein the main body is formed on outer surfaces thereof with an external structure selected from the group consisting of a plurality of depressions, a plurality of slits, a plurality of plate-fins, a plurality of pin-fins and a plurality of roughened areas.

20. The memory heat dissipation unit as claimed in claim 12, wherein a third acute-angled bent section is formed along a joint line between the first portion and a lower edge of the at least one first heat-receiving section; the third acute-angled bent section being optionally faced outward or inward relative to the first portion; and the first and the third acute-angled bent sections, when both being outward faced relative to the first portion, together defining a first clamping space on the first outer surface; and the first clamping space being able to hold a thermal conductive unit therein.

21. The memory heat dissipation unit as claimed in claim 12, wherein a first included angle is defined between the first portion and the connection portion, and a second included angle is defined between the second portion and the connection portion; and both of the first and the second included angles being smaller than or equal to 90°.

* * * * *